US008949517B2

(12) United States Patent
Cohen et al.

(10) Patent No.: US 8,949,517 B2
(45) Date of Patent: Feb. 3, 2015

(54) SELF-JOURNALING AND HIERARCHICAL CONSISTENCY FOR NON-VOLATILE STORAGE

(71) Applicant: LSI Corporation, San Jose, CA (US)

(72) Inventors: Earl T Cohen, Oakland, CA (US); Timothy L Canepa, Los Gatos, CA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/988,019

(22) PCT Filed: Oct. 4, 2012

(86) PCT No.: PCT/US2012/058583
§ 371 (c)(1),
(2) Date: May 17, 2013

(87) PCT Pub. No.: WO2013/052562
PCT Pub. Date: Apr. 11, 2013

(65) Prior Publication Data
US 2014/0082261 A1 Mar. 20, 2014

Related U.S. Application Data

(60) Provisional application No. 61/543,707, filed on Oct. 5, 2011.

(51) Int. Cl.
G06F 12/00 (2006.01)
G06F 12/02 (2006.01)
(Continued)

(52) U.S. Cl.
CPC ............ G06F 12/0246 (2013.01); G11C 16/02 (2013.01); G11C 16/06 (2013.01);
(Continued)

(58) Field of Classification Search
None
See application file for complete search history.

(56) References Cited

U.S. PATENT DOCUMENTS 6,763,424 B2 7/2004 Conkey
7,594,073 B2 9/2009 Hanebutte
(Continued)

FOREIGN PATENT DOCUMENTS

CN 1924830 A 3/2007
CN 101576834 A 11/2009
(Continued)

OTHER PUBLICATIONS

International Search Report and the Written Opinion in the parent PCT/US12/58583, 10 pages.
(Continued)

Primary Examiner — Matthew Bradley
Assistant Examiner — Daniel Tsui
(74) Attorney, Agent, or Firm — PatentVentures; Bennett Smith; Korbin Van Dyke

(57) ABSTRACT

A non-volatile storage system having Non-Volatile Memory (NVM) provides self-journaling and hierarchical consistency, enabling low-latency recovery and force unit access handshake. Mappings between host addresses and addresses in the NVM are maintained via one or more map entries, enabling locating of host data written to the NVM. Objects stored in the NVM include sufficient information to recover the object solely within the object itself. The NVM is managed as one or more data streams, a map stream, and a checkpoint stream. Host data is written to the data streams, map entries are written to the map stream, and checkpoints of map entries and other data structures are written to the checkpoint stream. Time markers embedded in the streams enable determination, during recovery, that selected portions of the streams are inconsistent with each other and are to be discarded.

15 Claims, 11 Drawing Sheets

(51) Int. Cl.
  *G11C 16/02* (2006.01)
  *G11C 16/06* (2006.01)
  *G06F 11/07* (2006.01)

(52) U.S. Cl.
  CPC ....... *G06F 11/07* (2013.01); *G06F 2212/1032* (2013.01); *G06F 2212/7201* (2013.01); *G06F 2212/7207* (2013.01)
  USPC .......................................................... 711/103

(56) References Cited

U.S. PATENT DOCUMENTS

| | | | |
|---|---|---|---|
| 2006/0174067 A1 | 8/2006 | Soules | |
| 2010/0037003 A1* | 2/2010 | Chen et al. | 711/103 |
| 2010/0131702 A1* | 5/2010 | Wong et al. | 711/103 |
| 2010/0169710 A1* | 7/2010 | Royer et al. | 714/22 |
| 2011/0099323 A1* | 4/2011 | Syu | 711/103 |
| 2012/0054419 A1 | 3/2012 | Chen et al. | |

FOREIGN PATENT DOCUMENTS

| | | |
|---|---|---|
| CN | 101930404 A | 12/2010 |
| EP | 0898228 B1 | 9/2005 |
| KR | 100445134 | 8/2004 |

OTHER PUBLICATIONS

CN Office Action (10 pgs. English translation and 7 pgs. CN original) of Mar. 10, 2014 of CN national entry of parent PCT/US12/58583, 17 pgs. total CN Search Report (2 pgs. English translation and 2 pgs. CN original) of Feb. 28, 2014 of CN national entry of parent PCT/US12/58583, 4 pgs. total.

KR Notice (3 pgs. English translation and 4 pgs. KR original) of Jun. 27, 2014 of KR national entry of parent PCT/US12/58583, 7 pgs. total.

Aug. 25, 2014 List of References Used in Art Rejections in Cases Related to, 1 pg.

* cited by examiner

SELF-JOURNALING AND HIERARCHICAL CONSISTENCY FOR NON-VOLATILE STORAGE

CROSS REFERENCE TO RELATED APPLICATIONS

Priority benefit claims for this application are made in the accompanying Application Data Sheet, Request, or Transmittal (as appropriate, if any). To the extent permitted by the type of the instant application, this application incorporates by reference for all purposes the following applications, all commonly owned with the instant application at the time the invention was made:

U.S. Provisional Application Ser. No. 61/543,707, filed 5 Oct. 2011, first named inventor Earl T. COHEN, and entitled SELF-JOURNALING AND HIERARCHICAL CONSISTENCY FOR NON-VOLATILE STORAGE.

BACKGROUND

1. Field

Advancements in non-volatile storage technology and manufacturing are needed to provide improvements in cost, profitability, performance, efficiency, and utility of use.

2. Related Art

Unless expressly identified as being publicly or well known, mention herein of techniques and concepts, including for context, definitions, or comparison purposes, should not be construed as an admission that such techniques and concepts are previously publicly known or otherwise part of the prior art. All references cited herein (if any), including patents, patent applications, and publications, are hereby incorporated by reference in their entireties, whether specifically incorporated or not, for all purposes.

SYNOPSIS

The invention may be implemented in numerous ways, e.g., as a process, an article of manufacture, an apparatus, a system, a composition of matter, and a computer readable medium such as a computer readable storage medium (e.g., media in an optical and/or magnetic mass storage device such as a disk, or an integrated circuit having non-volatile storage such as flash storage), or a computer network wherein program instructions are sent over optical or electronic communication links. The Detailed Description provides an exposition of one or more embodiments of the invention that enable improvements in cost, profitability, performance, efficiency, and utility of use in the field identified above. The Detailed Description includes an Introduction to facilitate understanding of the remainder of the Detailed Description. The Introduction includes Example Embodiments of one or more of systems, methods, articles of manufacture, and computer readable media in accordance with concepts described herein. As is discussed in more detail in the Conclusions, the invention encompasses all possible modifications and variations within the scope of the issued claims.

Figure 1A:
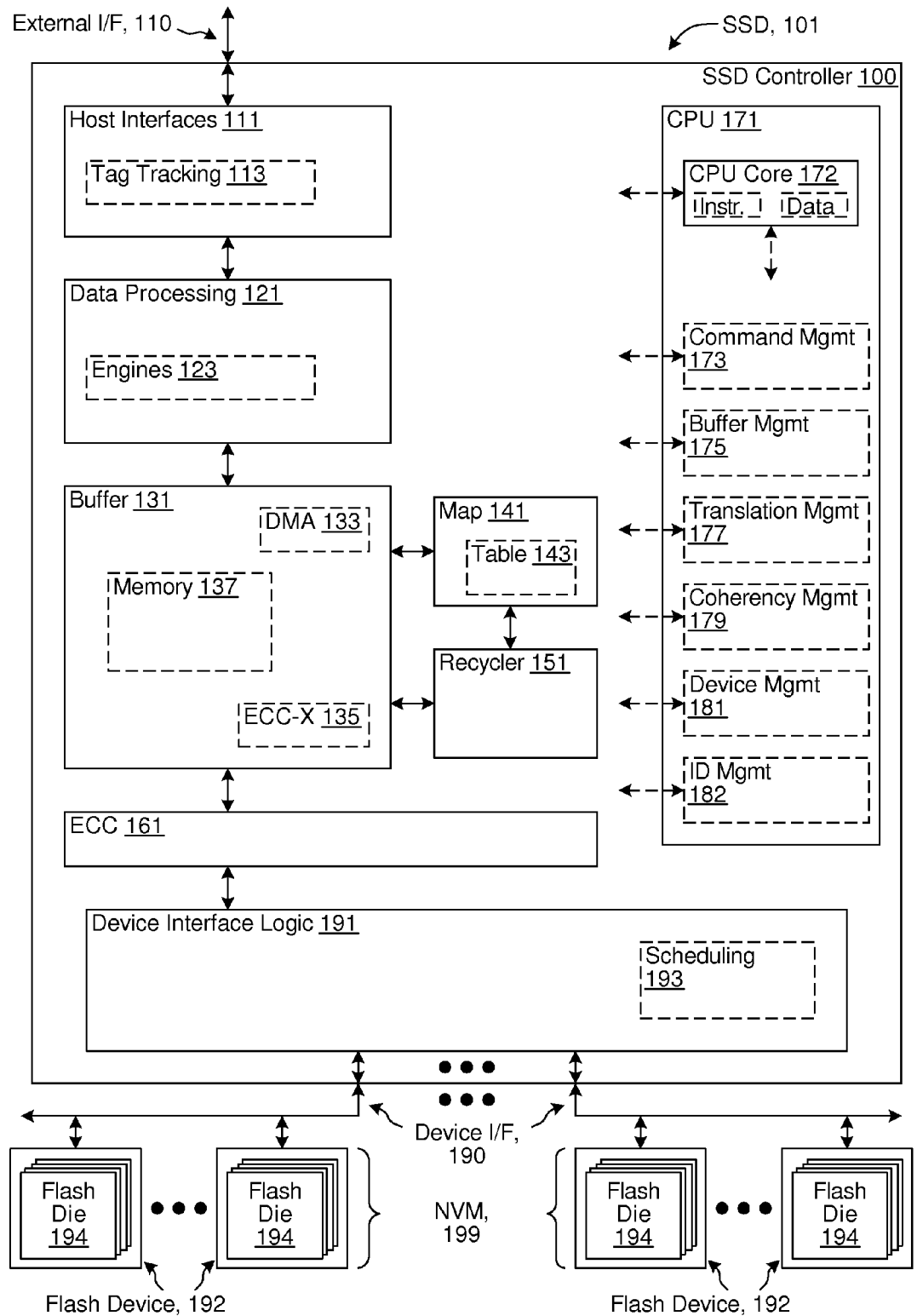
FIG. 1A illustrates selected details of an embodiment of a Solid-State Disk (SSD) including an SSD controller using self-journaling and hierarchical consistency for managing non-volatile storage, such as flash memories.

| List of Reference Symbols in Drawings | |
|---|---|
| Ref. Symbol | Element Name |
| 100 | SSD Controller |
| 101 | SSD |
| 102 | Host |
| 103 | (optional) Switch/Fabric/Intermediate Controller |
| 104 | Intermediate Interfaces |
| 105 | OS |
| 106 | FirmWare (FW) |
| 107 | Driver |
| 107D | dotted-arrow (Host Software ←→ I/O Device Communication) |
| 109 | Application |
| 109D | dotted-arrow (Application ←→ I/O Device Communication via driver) |
| 109V | dotted-arrow (Application ←→ I/O Device Communication via VF) |
| 110 | External Interfaces |
| 111 | Host Interfaces |
| 112C | (optional) Card Memory |
| 113 | Tag Tracking |
| 114 | Multi-Device Management Software |
| 115 | Host Software |
| 116 | I/O Card |
| 117 | I/O & Storage Devices/Resources |
| 118 | Servers |
| 119 | LAN/WAN |
| 121 | Data Processing |
| 123 | Engines |
| 131 | Buffer |
| 133 | DMA |
| 135 | ECC-X |
| 137 | Memory |
| 141 | Map |
| 143 | Table |

List of Reference Symbols in Drawings

| Ref. Symbol | Element Name |
|---|---|
| 151 | Recycler |
| 161 | ECC |
| 171 | CPU |
| 172 | CPU Core |
| 173 | Command Management |
| 175 | Buffer Management |
| 177 | Translation Management |
| 179 | Coherency Management |
| 180 | Memory Interface |
| 181 | Device Management |
| 182 | Identity Management |
| 190 | Device Interfaces |
| 191 | Device Interface Logic |
| 192 | Flash Device |
| 193 | Scheduling |
| 194 | Flash Die |
| 199 | NVM |
| 211 | LBA |
| 213 | LPN |
| 215 | Logical Offset |
| 221 | Map Info for LPN |
| 223 | Read Unit Address |
| 225 | Length in Read Units |
| 311 | Read Data |
| 313 | First Read Unit |
| 315 | Last Read Unit |
| 401A | Read Unit |
| 401B | Read Unit |
| 410B | Header Marker (HM) |
| 411A | Header 1 |
| 411B | Header 1 |
| 412B | Header 2 |
| 419A | Header N |
| 419B | Header N |
| 421A | Data Bytes |
| 421B | Data Bytes |
| 422B | Data Bytes |
| 429B | Data Bytes |
| 431A | Optional Padding Bytes |
| 431B | Optional Padding Bytes |
| 501 | Header |
| 511 | Type |
| 513 | Last Indicator |
| 515 | Flags |
| 517 | LPN |
| 519 | Length |
| 521 | Offset |
| 523 | Epoch |
| 600 | Striping Direction |
| 601, 603, 609 | Devices |
| 611, 613, 619, 641, 643, 649, 671, 673, 679 | Read Units |
| 621, 623, 629, 651, 653, 659, 681, 683, 689 | Pages |
| 631, 633, 639, 661, 663, 669, 691, 693, 699 | Blocks |
| 710.0, 710.65 | Flash Die |
| 710.0B0, 710.0B1, 710.0BB, 710.65B0, 710.65B1, 710.65BB | Blocks |
| 710.0P0, 710.0P1, 710.0PP, 710.65P0, 710.65P1, 710.65PP | Pages |
| 760.0, 760.1, 760.R | R-blocks |
| 800 | LBA to NVM Location Mapping |
| 810 | FLM |
| 810.1 | SLM Page/Length |
| 810.2 | SLM Page/Length |
| 810.M | SLM Page/Length |
| 810S | SLM Pointer |
| 820 | SLM Page |
| 820.1 | LB Page/Length |
| 820.2 | LB Page/Length |
| 820.N | LB Page/Length |
| 820L | LB Pointer |
| 821 | LBA |
| 822 | Integer Divider |
| 822Q | FLM Index |
| 822R | SLM Page Index |
| 823 | SLM Entries/SLM Page (CSR) |
| 900 | Data, Map, and Checkpoint Write Processing |
| 901 | Begin |
| 910 | Receive and Write Data |
| 911 | Receive Data from Host |
| 912 | Format Data |
| 913 | Self Journal Data |
| 914 | Timestamp Data |
| 915 | Buffer Data |
| 916 | Write Data to NVM |
| 916C | Complete |
| 920 | Create and Write Map Entries |
| 922 | Create SLM Entry for Data |
| 923 | Self Journal SLM Entry |
| 924 | Timestamp SLM Entry |
| 925 | Buffer SLM Entry |
| 926 | Write SLM Entry to NVM |
| 926C | Complete |
| 932 | Create FLM Entry for SLM Entry |
| 933 | Self Journal FLM Entry |
| 934 | Timestamp FLM Entry |
| 935 | Buffer FLM Entry |
| 936 | Write FLM Entry to NVM |
| 995 | Checkpoint Elements |
| 999 | End |
| 1020 | Data R-Blocks |
| 1021 | Data-1 |
| 1021E | Epoch-1 |
| 1022 | Data-2 |
| 1022E | Epoch-2 |
| 1023 | Data-3 |
| 1023E | Epoch-3 |
| 1030 | SLM (Map) R-Blocks |
| 1031 | SLM-1 |
| 1031E | Epoch-1 |
| 1032 | SLM-2 |
| 1032E | Epoch-2 |
| 1033 | SLM-3 |
| 1033E | Epoch-3 |
| 1040 | Checkpoint FIFO R-Blocks |
| 1041 | FLM-1 |
| 1041E | Epoch-1 |
| 1042 | FLM-2 |
| 1042E | Epoch-2 |
| 1043 | FLM-3 |
| 1043E | Epoch-3 |
| 1050 | Complete FLM |
| 1100 | FLM and SLM Restoration Processing |
| 1101 | Begin |
| 1111 | Locate FIFO End |
| 1112 | Locate Latest FLM Chunk and Oldest Epoch |
| 1113 | Restore FLM as of Oldest Epoch |
| 1114 | Update FLM According to SLM Updates |
| 1115 | Update SLM According to Data Updates |
| 1199 | End |

DETAILED DESCRIPTION

A detailed description of one or more embodiments of the invention is provided below along with accompanying figures illustrating selected details of the invention. The invention is described in connection with the embodiments. The embodiments herein are understood to be merely exemplary, the invention is expressly not limited to or by any or all of the embodiments herein, and the invention encompasses numerous alternatives, modifications, and equivalents. To avoid monotony in the exposition, a variety of word labels (such as: first, last, certain, various, further, other, particular, select, some, and notable) may be applied to separate sets of embodiments; as used herein such labels are expressly not meant to convey quality, or any form of preference or prejudice, but merely to conveniently distinguish among the separate sets. The order of some operations of disclosed processes is alterable within the scope of the invention. Wherever multiple embodiments serve to describe variations in process, method, and/or program instruction features, other embodiments are contemplated that in accordance with a predetermined or a dynamically determined criterion perform static and/or dynamic selection of one of a plurality of modes of operation corresponding respectively to a plurality of the multiple embodiments. Numerous specific details are set forth in the following description to provide a thorough understanding of the invention. The details are provided for the purpose of example and the invention may be practiced according to the claims without some or all of the details. For the purpose of clarity, technical material that is known in the technical fields related to the invention has not been described in detail so that the invention is not unnecessarily obscured.

Introduction

This introduction is included only to facilitate the more rapid understanding of the Detailed Description; the invention is not limited to the concepts presented in the introduction (including explicit examples, if any), as the paragraphs of any introduction are necessarily an abridged view of the entire subject and are not meant to be an exhaustive or restrictive description. For example, the introduction that follows provides overview information limited by space and organization to only certain embodiments. There are many other embodiments, including those to which claims will ultimately be drawn, discussed throughout the balance of the specification.

Acronyms

At least some of the various shorthand abbreviations (e.g. acronyms) defined here refer to certain elements used herein.

| Acronym | Description |
| --- | --- |
| AHCI | Advanced Host Controller Interface |
| API | Application Program Interface |
| ATA | Advanced Technology Attachment (AT Attachment) |
| BCH | Bose Chaudhuri Hocquenghem |
| CAM | Content Addressable Memory |
| CD | Compact Disk |
| CF | Compact Flash |
| CMOS | Complementary Metal Oxide Semiconductor |
| CPU | Central Processing Unit |
| CRC | Cyclic Redundancy Check |
| DAS | Direct Attached Storage |
| DDR | Double-Data-Rate |
| DMA | Direct Memory Access |
| DNA | Direct NAND Access |
| DRAM | Dynamic Random Access Memory |
| DVD | Digital Versatile/Video Disk |
| DVR | Digital Video Recorder |
| ECC | Error-Correcting Code |
| eMMC | embedded MultiMediaCard |
| eSATA | external Serial Advanced Technology Attachment |
| FIFO | First-In First-Out |
| FLM | First Level Map |
| FUA | Force Unit Access |

-continued

| Acronym | Description |
| --- | --- |
| GPS | Global Positioning System |
| HDD | Hard Disk Drive |
| I/O | Input/Output |
| IC | Integrated Circuit |
| IDE | Integrated Drive Electronics |
| JPEG | Joint Photographic Experts Group |
| LAN | Local Area Network |
| LB | Logical Block |
| LBA | Logical Block Address |
| LDPC | Low-Density Parity-Check |
| LPN | Logical Page Number |
| MLC | Multi-Level Cell |
| MMC | MultiMediaCard |
| MPEG | Moving Picture Experts Group |
| NAS | Network Attached Storage |
| NCQ | Native Command Queuing |
| NVM | Non-Volatile Memory |
| ONA | Optimized NAND Access |
| ONFI | Open NAND Flash Interface |
| OS | Operating System |
| PC | Personal Computer |
| PCIe | Peripheral Component Interconnect express (PCI express) |
| PDA | Personal Digital Assistant |
| PHY | PHYsical interface |
| POS | Point Of Sale |
| RAID | Redundant Array of Inexpensive/Independent Disks |
| RASIE | Redundant Array of Silicon Independent Elements |
| ReRAM | Resistive Random Access Memory |
| RS | Reed-Solomon |
| SAN | Storage Attached Network |
| SAS | Serial Attached Small Computer System Interface (Serial SCSI) |
| SATA | Serial Advanced Technology Attachment (Serial ATA) |
| SCSI | Small Computer System Interface |
| SD | Secure Digital |
| SDR | Single-Data-Rate |
| SLC | Single-Level Cell |
| SLM | Second-Level Map |
| SMART | Self-Monitoring Analysis and Reporting Technology |
| SRAM | Static Random Access Memory |
| SSD | Solid-State Disk/Drive |
| UFS | Unified Flash Storage |
| USB | Universal Serial Bus |
| VF | Virtual Function |
| WAN | Wide Area Network |

A first challenge in some non-volatile storage systems, such as some SSDs implemented using flash memory as NVM, is how to efficiently and reliably provide data integrity for data stored in NVM of the non-volatile storage system. An example of the first challenge is maintaining, in a consistent manner, data structures related to controlling a non-volatile storage system (e.g. included in a controller of an SSD) between when a write has been sent from a host (e.g. a computing host or an interfacing host) to the SSD and when all effects relating to the write have been saved in NVM (e.g. flash memory) of the non-volatile storage system. For instance, a malfunction (e.g. a crash, a power failure, or various types of failures of the SSD or circuitry therein) occurring in between the write and the saving, represents an event that the non-volatile storage system is enabled to process (e.g. via one or more recovery techniques) to ensure data integrity.

Another example of the first challenge is efficient processing of writes for high availability applications (e.g. a SATA write with an FUA bit set), where the high availability writes (sometimes referred to as "FUA" writes elsewhere herein) are requested by the host to be acknowledged as completed by a storage system only after completion with no errors. Higher performance results if latency of the high availability writes is minimized Note that all but FUA writes (sometimes referred to as "non-FUA" writes elsewhere herein) are acknowledged as though complete, in some embodiments and/or usage scenarios, even if some data of the non-FUA writes is not guaranteed to be saved in NVM in event of a malfunction. Embodiments are contemplated supporting high availability writes and other types of writes in various protocols, such as SAS, SATA, Fibre Channel, PCIe, and any protocol enabling storage communication between a host and a storage system.

A second challenge in some NVM technologies (such as some types of NAND flash memory), is how to reliably obtain performance adequate for some non-volatile storage systems (e.g. some SSD implementations), via reliable dynamic mapping of locations of data in flash memory. Dynamic mapping is performed since the flash memory is writable only after erasing. For instance, when an SSD receives a write of a particular LBA from a host, a new page (or, in some embodiments, one or more portions of one or more pages such as one or more read units) is allocated for storing write data of the write. An example of a read unit is a smallest portion of flash memory that is compatible with independent lower-level ECC processing (e.g. a single read unit is sufficient to use lower-level ECC to correct errors within the single read unit). A map associating the particular LBA with the new page (or the portions of the one or more pages such as one or more read units) is updated so that future read operations from the host to the particular LBA return the write data.

In some embodiments, the dynamic mapping is via a one-level map. For example, the dynamic mapping includes applying an LBA to a single table and obtaining a location in NVM where data corresponding to the LBA is stored. In some embodiments, the mapping is via a two-level map. For example, the dynamic mapping conceptually includes applying an LBA to a first table (e.g. an FLM), obtaining a pointer to a portion of a second table (e.g. a portion of an SLM), and then applying the LBA to the portion and obtaining a location in NVM where data corresponding to the LBA is stored.

An example of the second challenge is maintaining and managing the map even in an instance of a malfunction, e.g. occurring between writing of data for a write and updating of a map. For instance, if the write data is saved in flash memory but the map (e.g. one or more updates to the map corresponding to the saved write data) is not saved in the flash memory before a malfunction, then techniques are performed (such as after reset and/or reapplication of power) to enable recovering at least a portion of the saved write data from the flash memory, in at least some circumstances. In some embodiments and/or usage scenarios, FUA writes are acknowledged as soon as write data is non-volatilely saved, independently of whether any corresponding map updates are also non-volatilely saved, enabling, in some circumstances, improved performance. For another instance, if the map (or one or more updates to the map) is saved to the flash memory but at least a portion of corresponding write data is not saved to the flash memory (e.g. due to a malfunction), then techniques are performed (such as after reset and/or reapplication of power) to recognize that the map (or the one or more updates thereof) is inconsistent with data that has been saved to the flash memory. E.g. a determination is made that a portion of the map points to a portion of flash memory that has not been written since erasing, or has not been written with corresponding write data. For yet another instance, if a FUA write is acknowledged after associated write data and corresponding map information (or any updates thereto) have been saved in the flash memory, then in some embodiments and/or usage scenarios, a relatively large performance penalty accrues. The relatively large performance penalty arises due to one or more of limited queuing of some protocols (e.g. SATA), programming times for writing the write data and the map information to the flash memory, and a decrease in ability to aggregate map writes to reduce write amplification.

In some embodiments and/or usage scenarios, one or more of the aforementioned challenges are addressed by self-journaling and/or hierarchical consistency as applied to non-volatile storage, such as used in SSDs, or as managed by SSD controllers or NVM (e.g. flash memory) controllers. For example, a combination of self-journaling and hierarchical consistency enables rebuilding map information in whole or in part when there is a malfunction. In some circumstances, rebuilding the map information using self-journaling and hierarchical consistency techniques is more efficient than rebuilding without the techniques. For another example, a combination of self-journaling and hierarchical consistency enables a relatively low-latency FUA handshake.

In some embodiments and/or usage scenarios, self-journaling and/or hierarchical consistency are conceptually related to units NVM is managed in (e.g. R-blocks, described elsewhere herein), how NVM management units are written (e.g. bands), and how the writing of the management units is managed (e.g. as streams). An example of an R-block is a collection of NVM blocks (e.g. one block from each NVM die in an SSD, with NVM locations within the blocks being written in a striped fashion). An example of a band is a collection of R-blocks that information is serially written into (e.g. in a specific time order), and is optionally populated with information having similar properties and/or characteristics. An example of a stream is a band managed such that, within the band, information is written to NVM in a same order that the information is presented for writing into NVM (e.g. information presented at an earlier time is written before information presented at a later time). Conceptually, information that is written to a band that is managed as a stream is streamed into NVM in a FIFO-like fashion, organized in time order. Because success of writing to a particular NVM die is unpredictable in case of certain events, such as power failure, data written at an end of a stream has, in some circumstances, "holes." For example, a last-written die in a stream (prior to a power failure) succeeds in writing, but a previous die with an earlier portion of data of the stream does not succeed in writing, creating a hole (e.g., invalid, uncorrectable, and/or missing data) in a position of the previous die.

Some embodiments operate with a plurality of streams. E.g. the streams include one or more data streams for host data (e.g. write data associated with a write command from a host) and recycled data (e.g. data moved from one portion of the NVM to another to make larger contiguous portions of the NVM available). E.g. the streams include one or more map streams for mapping information (such as used to determine where in an NVM particular host write data has been stored). E.g. the streams include one or more checkpoint streams for storing entire or partial images of data structures used for managing NVM data storage (such as mapping information and usage statistics).

Self-journaling enables recovery of information consistent with a particular object using only information available in the particular object. For example, host data is stored in an NVM along with information identifying which LBAs the host data corresponds to. For another example, recycled data is stored in the NVM along with information identifying which LBAs the recycled data corresponds to. In some embodiments and/or usage scenarios, self-journaling, combined with knowing an order that all data was written, enables complete, albeit slow, recovery of map information and other data structures. For example, reading all (self-journaled) data of an SSD enables rebuilding of a map associating LBAs with physical locations in the NVM.

Hierarchical consistency enables determining which version of a data structure is governed by which version of another data structure, the versions being due, e.g., to separately written and/or checkpointed information. For example, a data stream has precedence over a map stream that in turn has precedence over a checkpoint stream. A malfunction results in information from the streams being stored in the NVM out-of-order with respect to each other. Time markers (e.g. epoch headers and/or timestamps) stored with the information in the streams enable determining relative ordering of the stream information that is stored in the NVM. In some embodiments and/or usage scenarios, self-journaling combined with hierarchical consistency enables complete and rapid recovery of map information and other data structures. For example, recovery of a map associating LBAs with physical locations in the NVM is made rapid by reading a version of the map from the map stream, and updating the map with updates obtained solely from the portion of the data stream that has precedence over the version of the map.

In some embodiments, hierarchical consistency enables use of rolling checkpoints. Rolling checkpoints of a data structure, such as a map, save state of portions of the data structure at separate respective times, such that the entire data structure is saved after a number greater than one of the rolling checkpoints of the data structure have been saved. Because operation continues between the saving of the rolling checkpoints, each of the rolling checkpoints is a snapshot of a respective portion of the data structure at the respective time that the respective portion of the data structure was saved by the rolling checkpoint. However, there is not necessarily a single, time-consistent copy of the entire data structure that has been saved. In some embodiments and/or usage scenarios, hierarchical consistency combined with timestamps enables recovery of the single, time-consistent copy of the entire data structure from the rolling checkpoints and information in other streams having hierarchical precedence over a stream containing the data structure. In further embodiments and/or usage scenarios, use of rolling checkpoints enables checkpointing to be less disruptive to system behavior, such as by impacting latency, by minimizing a duration of interruption and/or delay of normal processing due to the checkpointing.

Recovery techniques in a context that includes self-journaling and hierarchical consistency include storing (rolling) checkpoints to NVM, and in response to a malfunction, processing the stored (rolling) checkpoints to rebuild mapping information that tracks LBA to NVM location correspondence.

In various embodiments, one or more of data pages of data streams (having, e.g., host write data and recycled data), map pages of map streams (having, e.g., SLM entries or updates thereto), and checkpoint pages of checkpoint streams (having, e.g., FLM entries or updates thereto) stored in NVM are self-journaling. E.g. the pages, if present, contain information necessary to ensure coherency of the individual data structures. But this does not imply consistency among the data structures, which requires a notion of time, such as supplied by time markers. Data bands (including, e.g. data pages) and a map band (e.g. including map entries and/or updates) are managed as streams, and are organized (at least within a stream) in time order.

In some embodiments and/or usage scenarios, each host page (such as an LB) as stored in the NVM is associated with a header that contains the host page address (such as the LBA) of the host page. Thus, if a host page has been written to the NVM, the associated host page address (from the corresponding header) indicates which host page the written host page is. If an SLM entry corresponding to the write of the host page was not recorded to NVM (e.g. prior to a malfunction), then the host page itself contains information sufficient (the host page address) to reconstruct the SLM entry. In some contexts, the ability to reconstruct data from a container of the data is referred to as referential integrity.

In some embodiments, hierarchical consistency defines an ordering of data structures such that among multiple data structures that are separately written and/or checkpointed, a highest priority one (or portion of one) of the data structures is identifiable. For example, a data band takes precedence over a map band, and the map band takes precedence over a checkpoint FIFO, when the data band, the map band, and the checkpoint FIFO are all consistent (e.g. all in time order).

According to various embodiments, the map is one or more of: a one-level map; a two-level map; a multi-level map; a direct map; an associative map; and any other means of associating the LBAs of the host protocol with the physical storage addresses in the NVM. For example, in some embodiments, a two-level map includes a first-level map that associates a first function of an LBA with a respective address in the NVM of one of a plurality of second-level map pages, and each of the second-level map pages associates a second function of the LBA with a respective address in the NVM of data corresponding to the LBA. In further embodiments, an example of the first function of the LBA and the second function of the LBA are a quotient and a remainder obtained when dividing by a fixed number of entries included in each of the second-level map pages. The plurality of second-level map pages is collectively termed a second-level map. Herein, references to one or more entries of a map refers to one or more entries of any type of map, including a one-level map, a first-level of a two-level map, a second-level of a two-level map, any level of a multi-level map, or any other type of map having entries.

According to various embodiments, each of the map pages of a second-level map (or a lower-level of a multi-level map) one or more of: includes a same number of entries as others of the map pages; includes a different number of entries than at least some others of the map pages; includes entries of a same granularity as others of the map pages; includes entries of a different granularity than others of the map pages; includes entries that are all of a same granularity; includes entries that are of multiple granularities; includes a respective header specifying a format and/or layout of contents of the map page; and has any other format, layout, or organization to represent entries of the map page. For example, a first second-level map page has a specification of a granularity of 4 KB per entry, and a second second-level map page has a specification of a granularity of 8 KB per entry and only one half as many entries as the first second-level map page.

In further embodiments, entries of a higher-level map include the format and/or layout information of the corresponding lower-level map pages. For example, each of the entries in a first-level map includes a granularity specification for entries in the associated second-level map page.

In some embodiments, the map includes a plurality of entries, each of the entries associating one or more LBAs with information selectively including a respective location in the NVM where data of the LBAs is stored. For example, LBAs specify 512B sectors, and each entry in the map is associated with an aligned eight-sector (4 KB) region of the LBAs.

According to various embodiments, the information of the entries of the map includes one or more of: a location in the NVM; an address of a read unit in the NVM; a number of read units to read to obtain data of associated LBAs stored in the NVM; a size of the data of the associated LBAs stored in the NVM, the size having a granularity that is optionally and/or selectively larger than one byte; an indication that the data of the associated LBAs is not present in the NVM, such as due to the data of the associated LBAs being trimmed; a property of the data of the associated LBAs, including any non-standard modifiers applied to the data of the associated LBAs; and any other meta-data, property, or nature of the data of the associated LBAs.

In some embodiments, addresses in the NVM are grouped into regions to reduce a number of bits required to represent one of the addresses. For example, if LBAs of the I/O device are divided into 64 regions, and the NVM is divided into 64 regions, one for each of the LBA regions, then a map entry associated with a particular LBA requires six fewer address bits since one of the regions in the NVM is able to be determined by the region of the particular LBA. According to various embodiments, an association between regions of the LBAs and regions of the NVM is by one or more of: equality; a direct association, such as 1-to-1 numeric function; a table look-up; a dynamic mapping; and any other method for associating two sets of numbers.

In various embodiments, the location in the NVM includes an address of one of a plurality of read units, and a length and/or a span in read units. The length is a size of a particular one of a plurality of data items stored in the NVM, the particular data item associated with the entry of the map including the length. According to various embodiments, the length has a granularity of one or more of one byte; more than one byte; one read unit; a specified fraction of a read unit; a granularity according to a maximum allowed compression rate of one of the data items; and any other granularity used to track storage usage. The span is a number of reads units, such as an integer number of read units, storing a respective portion of the particular data item. In further embodiments and/or usage scenarios, a first read unit in the span of read units and/or a last read unit in the span of read units optionally and/or selectively store some or all of multiple ones of the data items. In some embodiments and/or usage scenarios, the length and/or the span are stored encoded, such as by storing the length (sometimes termed size in a context with length and/or span encoded) as an offset from the span. In some embodiments and/or usage scenarios, unused encodings of the length and/or the span encode additional information, such as an indication of a non-standard modifier, or such as an indication as to whether an associated data item is present in the NVM.

Encoding the location in the NVM as an address and a length enables data stored in the NVM to vary in size. For example, a first 4 KB region is compressed to 400B in size, is stored entirely in a single read unit, and has a length of one read unit, whereas a second 4 KB region is incompressible, spans more than one read unit, and has a length more than one read unit. In further embodiments, having a length and/or span in read units of storage associated with a region of the LBAs enables reading solely a required portion of the NVM to retrieve data of the region of the LBAs.

In some embodiments, each of the entries of the map includes information, sometimes termed meta-data, specifying properties of a region of the LBAs associated with the entry. In further embodiments, at least some of the meta-data is of a granularity finer than that of the region, such as by having separate meta-data specifications for each of a plurality of LBAs of the region. According to various embodiments, the meta-data includes one or more non-standard modifiers applicable to and/or to be used to modify and/or control writing of, access to, reading of, and/or recycling of data in the NVM associated with the region.

Example Embodiments

In concluding the introduction to the detailed description, what follows is a collection of example embodiments, including at least some explicitly enumerated as "ECs" (Example Combinations), providing additional description of a variety of embodiment types in accordance with the concepts described herein; these examples are not meant to be mutually exclusive, exhaustive, or restrictive; and the invention is not limited to these example embodiments but rather encompasses all possible modifications and variations within the scope of the issued claims and their equivalents.

EC1) A method comprising:
arranging a series of data units in a Non-Volatile Memory (NVM) in a first order, each of the data units associated with a respective one of a plurality of timestamps;
arranging a series of data map units in the NVM in a second order, each of the data map units associated with a respective one of the timestamps;
wherein each of the data map units comprises a location in the NVM of a corresponding one of the data units; and
wherein the respective timestamp associated with each of the data units is at or before the respective timestamp associated with the corresponding data map unit.

EC2) The method of EC1, wherein:
each of the data units corresponds to a respective data write from a host to a respective Logical Block Address (LBA);
a prior one and a subsequent one of the data units correspond to ones of the data writes to a same one of the respective LBAs; and
the prior data unit does not have an associated one of the data map units.

EC3) The method of EC1, further comprising, subsequent to a power failure:
determining a latest valid and contiguous one of the data units;
determining a latest valid and contiguous one of the data map units wherein the respective timestamp associated with the latest valid and contiguous one of the data map units is at or before the respective timestamp associated with the latest valid and contiguous one of the data units;
recovering only ones of the data map units up to the latest valid and contiguous one of the data map units; and
whereby any of the data map units associated with any of the respective timestamps after the respective timestamp associated with the latest valid and contiguous one of the data units are ignored in recovery.

EC4) The method of EC1, wherein the data units are data storage units.

EC5) A method comprising:
writing a series of data storage units in a Non-Volatile Memory (NVM), each of the data storage units associated with a respective one of a plurality of timestamps;
writing a series of data map units in the NVM, each of the data map units associated with a respective one of the timestamps;
wherein each of the data map units comprises a location in the NVM of a corresponding one of the data storage units; and
wherein the respective timestamp associated with each of the data storage units indicates a relative age that is identical to or older than a relative age indicated by the respective timestamp associated with the corresponding data map unit.

EC6) The method of EC5, wherein the writing of the data storage units is in accordance with a first order and the writing of the data map units is in accordance with a second order.

EC7) The method of EC5, wherein the data storage units are arranged in accordance with a first order in the NVM and the data map units are arranged in accordance with a second order in the NVM.

EC8) The methods of EC1, EC6, or EC7, wherein the first order is different from the second order.

EC9) The method of EC5, wherein:
- a first one of the data storage units corresponds to a first data write from a host to a particular Logical Block Address (LBA);
- a second one of the data storage units corresponds to a second data write from the host to the particular LBA;
- the first data write precedes, in time order, the second data write; and
- none of the data map units correspond to the first data storage unit.

EC10) The method of EC6, further comprising, subsequent to an event:
- determining, in accordance with the first order, a latest valid and contiguous one of the data storage units;
- determining, in accordance with the second order, a latest valid and contiguous one of the data map units associated with a one of the respective timestamps indicating a relative age that is identical to or older than a relative age indicated by the respective timestamp associated with the latest valid and contiguous one of the data storage units; and
- recovering, in accordance with the first and the second orders, only ones of the data map units up to the latest valid and contiguous one of the data map units.

EC11) The method of EC6, further comprising:
- determining, in accordance with the first order, a first one of the data storage units that is a latest valid and contiguous one of the data storage units;
- determining, in accordance with the second order, a latest valid and contiguous one of the data map units associated with a one of the respective timestamps indicating a relative age that is identical to or older than a relative age indicated by the respective timestamp associated with the latest valid and contiguous one of the data storage units;
- determining, in accordance with the first order, a second one of the data storage units that is a latest one of the data storage units associated with a one of the respective timestamps indicating a relative age that is identical or prior to a determined amount preceding the relative age indicated by the respective timestamp associated with the latest valid and contiguous one of the data map units; and
- recovering, in accordance with the first and second orders, ones of the data map units up to the latest valid and contiguous one of the data map units using ones of the data units solely from the second of the data storage units through the first of the data storage units.

EC12) The method of EC 11, further comprising:
- identifying, for each modified one of the data map units not previously written to the NVM, a respective one of the timestamps associated with an oldest update equal to the respective timestamp associated with a particular one of the data storage units, the modified data map unit comprising the location in the NVM of the particular data storage unit; and
- writing each of the modified data map units not previously written to the NVM, to the NVM at or prior to writing one of the data storage units associated with a one of the respective timestamps more than the determined amount following the respective timestamp associated with the oldest update of the modified data map unit.

EC13) The method of EC 10, further comprising ignoring, with respect to the recovering, any of the data map units having a respective timestamp indicating a relative age that is younger than a relative age indicated by the respective timestamp of the latest valid and contiguous one of the data storage units.

EC14) The method of EC10, wherein the event comprises a malfunction.

EC15) The method of EC14, wherein the malfunction comprises one or more of
- a power failure,
- a crash, and
- a circuitry failure.

EC16) The methods of EC4 or EC5, wherein at least two of the data map units comprise a same location, the same location being that of at least two respective ones of the data units.

EC17) The methods of EC4 or EC5, further comprising storing, with at least some of the data storage units, the respective timestamp associated with the data storage unit, and storing, with at least some of the data map units, the respective timestamp associated with the data map unit.

EC18) The methods of EC4 or EC5, wherein sufficient ones of the respective timestamps of the data storage units are stored with the data storage units such that the association between each of the data storage units and the respective timestamp of the respective data storage unit is determinable by reading the NVM.

EC19) The methods of EC4 or EC5, wherein each of at least some of the respective timestamps of the data storage units is stored in the NVM with the associated data storage unit.

EC20) The methods of EC4 or EC5, wherein sufficient ones of the respective timestamps of the data map units are stored with the data map units such that the association between each of the data map units and the respective timestamp of the respective data map unit is determinable by reading the NVM.

EC21) The methods of EC4 or EC5, wherein each of at least some of the respective timestamps of the data map units is stored in the NVM with the associated data map unit.

EC22) The methods of EC4 or EC5, wherein a particular one of the data storage units is stored in the NVM with the respective timestamp associated with the particular data storage unit, and a particular one of the data map units is stored in the NVM with the respective timestamp associated with the particular data map unit.

EC23) A method comprising:
- writing a plurality of storage units to a Non-Volatile Memory (NVM) in accordance with a storage stream, each of the storage units comprising a data portion and a corresponding timestamp portion;
- writing a plurality of map units to the NVM in accordance with a map stream, each of the map units comprising an entry portion and a corresponding timestamp portion;
- wherein each of at least some of the entry portions enable determining where respective Logical Blocks (LBs) are written in the NVM by specifying at least a corresponding one of the data portions;

wherein a temporal order is indicated by the timestamp portions, the storage unit timestamp portions are monotonically increasing according to a timestamp order with respect to each other, and the map unit timestamp portions are monotonically increasing according to the timestamp order with respect to each other; and wherein there is at least one particular point in time when at least one of the map units written to the NVM has a timestamp portion that is later, according to the temporal order, than the latest, according to the temporal order, of the storage unit timestamp portions written to the NVM at the particular point in time.

EC24) The method of EC23, wherein the writing of the storage units writes the storage units in a time order corresponding to the temporal order as indicated by the storage unit timestamp portions, and the writing of the map units writes the map units in a time order corresponding to the temporal order as indicated by the map unit timestamp portions.

EC25) The method of EC23, further comprising writing one or more checkpoint units to the NVM in accordance with a checkpoint stream, each of the checkpoint units comprising a map portion and a corresponding timestamp portion, and wherein the checkpoint timestamp portions are monotonically increasing according to the timestamp order with respect to each other.

EC26) The method of EC25, wherein the writing of the checkpoint units writes the checkpoint units in time order corresponding to the temporal order as indicated by the checkpoint timestamp portions.

EC27) The method of EC25, wherein a contiguous group of a predetermined number of the checkpoint units comprises at least an entire checkpoint of a map that the entry portions are in accordance with.

EC28) The method of EC27, further comprising restoring the map based at least in part on one or more portions of one or more of the map portions and/or the checkpoint unit timestamp portions.

EC29) The method of EC28, wherein the restoring is further based at least in part on one or more portions of one or more of the entry portions and/or the map unit timestamp portions.

EC30) The method of EC29, wherein the restoring is further based at least in part on one or more portions of one or more of the data portions and/or the storage unit timestamp portions.

EC31) The method of EC30, wherein each of the data portions comprises respective one or more data units and respective corresponding one or more headers, each of the headers identifying a respective mapping between a respective corresponding one of the data units and one of the LBs, the mappings enabling determining where respective ones of the LBs are written in the NVM as respective ones of the data units; and wherein the restoring is further based at least in part on one or more of the respective headers comprised in the storage units written to the NVM.

EC32) The method of EC31, wherein a particular one of the entry portions determines the respective data portion of the respective LB, the respective data portion comprises a particular one of the headers, and the particular header identifies the respective mapping between a particular one of the data units and the respective LB of the particular entry portion.

EC33) The method of EC27, wherein the map is a one-level map.

EC34) The method of EC33, further comprising caching and/or buffering at least a portion of the map; and wherein at least some of at least one of the map portions is in accordance with the caching and/or the buffering.

EC35) The method of EC27, wherein the map is a two-level map comprising a first-level map and a second-level map, the map portions corresponding to portions of the first-level map and the entry portions corresponding to entries of the second-level map.

EC36) The method of EC35, further comprising caching and/or buffering at least a portion of the first-level map and/or the second-level map; and wherein at least some of at least one of the map portions and the entry portions is in accordance with the caching and/or the buffering.

EC37) The method of EC27, wherein each of the map portions is in accordance with all of the entry portions having corresponding timestamp portions that are earlier, according to the temporal order, than the corresponding timestamp portion of the respective map portion.

EC38) The method of EC25, wherein the one particular point in time is a first particular point in time, and there is at least a second particular point in time when at least one of the checkpoint units written to the NVM has a timestamp portion that is later, according to the temporal order, than the latest, according to the temporal order, of the map unit timestamp portions written to the NVM at the second particular point in time.

EC39) The method of EC25, wherein the one particular point in time is a first particular point in time, and there is at least a second particular point in time when at least one of the checkpoint units written to the NVM has a timestamp portion that is later, according to the temporal order, than the latest, according to the temporal order, of the storage unit timestamp portions written to the NVM at the second particular point in time.

EC40) The method of EC23, wherein the plurality of storage units is a first plurality of storage units, the storage stream is a first storage stream, and further comprising writing a second plurality of storage units to the NVM in accordance with a second storage stream, each of the second storage units comprising a data portion and a corresponding timestamp portion, and the second storage unit timestamp portions monotonically increasing according to the timestamp order with respect to each other.

EC41) The method of EC40, wherein the writing of the second storage units writes the second storage units in time order corresponding to the temporal order as indicated by the second storage unit timestamp portions.

EC42) The method of EC40, wherein at least one of the second storage units is written in time order between two of the first storage units, and the timestamp portion of the at least one second storage unit is between, according to the temporal order, the timestamp portions of the two first storage units.

EC43) The method of EC40, wherein at least one of the data portions of the first plurality of storage units comprises host data from a host in association with a host data write command, and wherein at least one of the data portions of the second plurality of storage units comprises recycled data read from the NVM in response to a recycling operation.

EC44) The method of EC23, wherein the timestamp portions are encoded to enable comparing the timestamp portions according to the temporal order via numerical comparison of the timestamp portions being compared.

EC45) The method of EC44, wherein the numerical comparison ignores one or more contiguous most-significant bits of the timestamp portions being compared.

EC46) The method of EC44, wherein if a particular one of the storage unit timestamp portions being compared is numerically identical to a particular one of the map unit timestamp portions being compared, then the comparing is determined by a predetermination that, when timestamp portions are identical, the storage unit timestamp portion being compared is earlier than the map unit timestamp portion being compared.

EC47) The method of EC46, wherein the numerical identity ignores one or more contiguous most-significant bits of the timestamp portions being compared.

EC48) The method of EC23, wherein each of the entry portions is in accordance with all of the data portions having corresponding timestamp portions that are earlier, according to the temporal order, than the corresponding timestamp portion of the respective entry portion.

EC49) The method of EC23, wherein each of the storage units is written atomically.

EC50) The method of EC23, wherein each of the map units is written atomically.

EC51) The method of EC23, wherein at least one of the data portions comprises host data from a host in association with a host data write command.

EC52) The method of EC23, wherein at least one of the data portions comprises recycled data read from the NVM in response to a recycling operation.

EC53) The method of EC23, wherein each of the data portions comprises respective one or more data units and respective corresponding one or more headers, each of the headers identifying a respective mapping between a respective corresponding one of the data units and one of the LBs, and the mappings enabling determining where respective ones of the LBs are written in the NVM as respective ones of the data units.

EC54) The method of EC53, wherein each of the headers is written contiguously in the NVM with the respective data unit identified by the respective header.

EC55) The methods of EC2, EC9, EC43, or EC51, further comprising interfacing with the host in accordance with the data writes.

EC56) The method of EC55, wherein the interfacing is compatible with a storage interface standard.

EC57) The methods of EC2, EC9, EC43, or EC51, wherein the host is a computing host, and further comprising operating the computing host in accordance with the data writes.

EC58) The methods of EC1, EC5, or EC23, wherein the NVM comprises one or more flash memories.

EC59) The method of EC58, further comprising interfacing with the flash memories via a flash memory interface.

EC60) A tangible computer readable medium having a set of instructions stored therein that when executed by a processing element cause the processing element to perform and/or control operations comprising:
  arranging a series of data units in a Non-Volatile Memory (NVM) in a first order, each of the data units associated with a respective one of a plurality of timestamps;
  arranging a series of data map units in the NVM in a second order, each of the data map units associated with a respective one of the timestamps;
  wherein each of the data map units comprises a location in the NVM of a corresponding one of the data units; and
  wherein the respective timestamp associated with each of the data units is at or before the respective timestamp associated with the corresponding data map unit.

EC61) The tangible computer readable medium of EC60, wherein:
  each of the data units corresponds to a respective data write from a host to a respective Logical Block Address (LBA);
  a prior one and a subsequent one of the data units correspond to ones of the data writes to a same one of the respective LBAs; and
  the prior data unit does not have an associated one of the data map units.

EC62) The tangible computer readable medium of EC60, wherein the operations further comprise:
  determining, subsequent to a power failure, a latest valid and contiguous one of the data units;
  determining, subsequent to the power failure, a latest valid and contiguous one of the data map units wherein the respective timestamp associated with the latest valid and contiguous one of the data map units is at or before the respective timestamp associated with the latest valid and contiguous one of the data units;
  recovering only ones of the data map units up to the latest valid and contiguous one of the data map units; and
  whereby any of the data map units associated with any of the respective timestamps after the respective timestamp associated with the latest valid and contiguous one of the data units are ignored in recovery.

EC63) The tangible computer readable medium of EC60, wherein the data units are data storage units.

EC64) A tangible computer readable medium having a set of instructions stored therein that when executed by a processing element cause the processing element to perform and/or control operations comprising:
  writing a series of data storage units in a Non-Volatile Memory (NVM), each of the data storage units associated with a respective one of a plurality of timestamps;
  writing a series of data map units in the NVM, each of the data map units associated with a respective one of the timestamps;
  wherein each of the data map units comprises a location in the NVM of a corresponding one of the data storage units; and
  wherein the respective timestamp associated with each of the data storage units indicates a relative age that is identical to or older than a relative age indicated by the respective timestamp associated with the corresponding data map unit.

EC65) The tangible computer readable medium of EC64, wherein the writing of the data storage units is in accordance with a first order and the writing of the data map units is in accordance with a second order.

EC66) The tangible computer readable medium of EC64, wherein the data storage units are arranged in accordance with a first order in the NVM and the data map units are arranged in accordance with a second order in the NVM.

EC67) The tangible computer readable mediums of EC60, EC65, or EC66, wherein the first order is different from the second order.

EC68) The tangible computer readable medium of EC64, wherein:
  a first one of the data storage units corresponds to a first data write from a host to a particular Logical Block Address (LBA);
  a second one of the data storage units corresponds to a second data write from the host to the particular LBA;
  the first data write precedes, in time order, the second data write; and
  none of the data map units correspond to the first data storage unit.

EC69) The tangible computer readable medium of EC65, wherein the operations further comprise:
  determining, subsequent to an event and in accordance with the first order, a latest valid and contiguous one of the data storage units;
  determining, subsequent to the event and in accordance with the second order, a latest valid and contiguous one of the data map units associated with a one of the respective timestamps indicating a relative age that is identical to or older than a relative age indicated by the respective timestamp associated with the latest valid and contiguous one of the data storage units; and recovering, in accordance with the first and the second orders, only ones of the data map units up to the latest valid and contiguous one of the data map units.

EC70) The tangible computer readable medium of EC65, wherein the operations further comprise:

determining, in accordance with the first order, a first one of the data storage units that is a latest valid and contiguous one of the data storage units;

determining, in accordance with the second order, a latest valid and contiguous one of the data map units associated with a one of the respective timestamps indicating a relative age that is identical to or older than a relative age indicated by the respective timestamp associated with the latest valid and contiguous one of the data storage units;

determining, in accordance with the first order, a second one of the data storage units that is a latest one of the data storage units associated with a one of the respective timestamps indicating a relative age that is identical or prior to a determined amount preceding the relative age indicated by the respective timestamp associated with the latest valid and contiguous one of the data map units; and recovering, in accordance with the first and second orders, ones of the data map units up to the latest valid and contiguous one of the data map units using ones of the data units solely from the second of the data storage units through the first of the data storage units.

EC71) The tangible computer readable medium of EC70, wherein the operations further comprise:

identifying, for each modified one of the data map units not previously written to the NVM, a respective one of the timestamps associated with an oldest update equal to the respective timestamp associated with a particular one of the data storage units, the modified data map unit comprising the location in the NVM of the particular data storage unit; and writing each of the modified data map units not previously written to the NVM, to the NVM at or prior to writing one of the data storage units associated with a one of the respective timestamps more than the determined amount following the respective timestamp associated with the oldest update of the modified data map unit.

EC72) The tangible computer readable medium of EC69, wherein the operations further comprise ignoring, with respect to the recovering, any of the data map units having a respective timestamp indicating a relative age that is younger than a relative age indicated by the respective timestamp of the latest valid and contiguous one of the data storage units.

EC73) The tangible computer readable medium of EC69, wherein the event comprises a malfunction.

EC74) The tangible computer readable medium of EC73, wherein the malfunction comprises one or more of a power failure, a crash, and a circuitry failure.

EC75) The tangible computer readable mediums of EC63 or EC64, wherein at least two of the data map units comprise a same location, the same location being that of at least two respective ones of the data units.

EC76) The tangible computer readable mediums of EC63 or EC64, wherein the operations further comprise storing, with at least some of the data storage units, the respective timestamp associated with the data storage unit, and storing, with at least some of the data map units, the respective timestamp associated with the data map unit.

EC77) The tangible computer readable mediums of EC63 or EC64, wherein sufficient ones of the respective timestamps of the data storage units are stored with the data storage units such that the association between each of the data storage units and the respective timestamp of the respective data storage unit is determinable by reading the NVM.

EC78) The tangible computer readable mediums of EC63 or EC64, wherein each of at least some of the respective timestamps of the data storage units is stored in the NVM with the associated data storage unit.

EC79) The tangible computer readable mediums of EC63 or EC64, wherein sufficient ones of the respective timestamps of the data map units are stored with the data map units such that the association between each of the data map units and the respective timestamp of the respective data map unit is determinable by reading the NVM.

EC80) The tangible computer readable mediums of EC63 or EC64, wherein each of at least some of the respective timestamps of the data map units is stored in the NVM with the associated data map unit.

EC81) The tangible computer readable mediums of EC63 or EC64, wherein a particular one of the data storage units is stored in the NVM with the respective timestamp associated with the particular data storage unit, and a particular one of the data map units is stored in the NVM with the respective timestamp associated with the particular data map unit.

EC82) A tangible computer readable medium having a set of instructions stored therein that when executed by a processing element cause the processing element to perform and/or control operations comprising:

writing a plurality of storage units to a Non-Volatile Memory (NVM) in accordance with a storage stream, each of the storage units comprising a data portion and a corresponding timestamp portion;

writing a plurality of map units to the NVM in accordance with a map stream, each of the map units comprising an entry portion and a corresponding timestamp portion;

wherein each of at least some of the entry portions enable determining where respective Logical Blocks (LBs) are written in the NVM by specifying at least a corresponding one of the data portions;

wherein a temporal order is indicated by the timestamp portions, the storage unit timestamp portions are monotonically increasing according to a timestamp order with respect to each other, and the map unit timestamp portions are monotonically increasing according to the timestamp order with respect to each other; and wherein there is at least one particular point in time when at least one of the map units written to the NVM has a timestamp portion that is later, according to the temporal order, than the latest, according to the temporal order, of the storage unit timestamp portions written to the NVM at the particular point in time.

EC83) The tangible computer readable medium of EC82, wherein the writing of the storage units writes the storage units in a time order corresponding to the temporal order as indicated by the storage unit timestamp portions, and the writing of the map units writes the map units in a time order corresponding to the temporal order as indicated by the map unit timestamp portions.

EC84) The tangible computer readable medium of EC82, wherein the operations further comprise writing one or more checkpoint units to the NVM in accordance with a checkpoint stream, each of the checkpoint units comprising a map portion and a corresponding timestamp portion, and wherein the checkpoint timestamp portions are monotonically increasing according to the timestamp order with respect to each other.

EC85) The tangible computer readable medium of EC84, wherein the writing of the checkpoint units writes the checkpoint units in time order corresponding to the temporal order as indicated by the checkpoint timestamp portions.

EC86) The tangible computer readable medium of EC84, wherein a contiguous group of a predetermined number of the checkpoint units comprises at least an entire checkpoint of a map that the entry portions are in accordance with.

EC87) The tangible computer readable medium of EC86, wherein the operations further comprise restoring the map based at least in part on one or more portions of one or more of the map portions and/or the checkpoint unit timestamp portions.

EC88) The tangible computer readable medium of EC87, wherein the restoring is further based at least in part on one or more portions of one or more of the entry portions and/or the map unit timestamp portions.

EC89) The tangible computer readable medium of EC88, wherein the restoring is further based at least in part on one or more portions of one or more of the data portions and/or the storage unit timestamp portions.

EC90) The tangible computer readable medium of EC89, wherein each of the data portions comprises respective one or more data units and respective corresponding one or more headers, each of the headers identifying a respective mapping between a respective corresponding one of the data units and one of the LBs, the mappings enabling determining where respective ones of the LBs are written in the NVM as respective ones of the data units; and wherein the restoring is further based at least in part on one or more of the respective headers comprised in the storage units written to the NVM.

EC91) The tangible computer readable medium of EC90, wherein a particular one of the entry portions determines the respective data portion of the respective LB, the respective data portion comprises a particular one of the headers, and the particular header identifies the respective mapping between a particular one of the data units and the respective LB of the particular entry portion.

EC92) The tangible computer readable medium of EC86, wherein the map is a one-level map.

EC93) The tangible computer readable medium of EC92, wherein the operations further comprise caching and/or buffering at least a portion of the map; and wherein at least some of at least one of the map portions is in accordance with the caching and/or the buffering.

EC94) The tangible computer readable medium of EC86, wherein the map is a two-level map comprising a first-level map and a second-level map, the map portions corresponding to portions of the first-level map and the entry portions corresponding to entries of the second-level map.

EC95) The tangible computer readable medium of EC94, wherein the operations further comprise caching and/or buffering at least a portion of the first-level map and/or the second-level map; and wherein at least some of at least one of the map portions and the entry portions is in accordance with the caching and/or the buffering.

EC96) The tangible computer readable medium of EC86, wherein each of the map portions is in accordance with all of the entry portions having corresponding timestamp portions that are earlier, according to the temporal order, than the corresponding timestamp portion of the respective map portion.

EC97) The tangible computer readable medium of EC84, wherein the one particular point in time is a first particular point in time, and there is at least a second particular point in time when at least one of the checkpoint units written to the NVM has a timestamp portion that is later, according to the temporal order, than the latest, according to the temporal order, of the map unit timestamp portions written to the NVM at the second particular point in time.

EC98) The tangible computer readable medium of EC84, wherein the one particular point in time is a first particular point in time, and there is at least a second particular point in time when at least one of the checkpoint units written to the NVM has a timestamp portion that is later, according to the temporal order, than the latest, according to the temporal order, of the storage unit timestamp portions written to the NVM at the second particular point in time.

EC99) The tangible computer readable medium of EC82, wherein the plurality of storage units is a first plurality of storage units, the storage stream is a first storage stream, and further comprising writing a second plurality of storage units to the NVM in accordance with a second storage stream, each of the second storage units comprising a data portion and a corresponding timestamp portion, and the second storage unit timestamp portions monotonically increasing according to the timestamp order with respect to each other.

EC100) The tangible computer readable medium of EC99, wherein the writing of the second storage units writes the second storage units in time order corresponding to the temporal order as indicated by the second storage unit timestamp portions.

EC101) The tangible computer readable medium of EC99, wherein at least one of the second storage units is written in time order between two of the first storage units, and the timestamp portion of the at least one second storage unit is between, according to the temporal order, the timestamp portions of the two first storage units.

EC102) The tangible computer readable medium of EC99, wherein at least one of the data portions of the first plurality of storage units comprises host data from a host in association with a host data write command, and wherein at least one of the data portions of the second plurality of storage units comprises recycled data read from the NVM in response to a recycling operation.

EC103) The tangible computer readable medium of EC82, wherein the timestamp portions are encoded to enable comparing the timestamp portions according to the temporal order via numerical comparison of the timestamp portions being compared.

EC104) The tangible computer readable medium of EC103, wherein the numerical comparison ignores one or more contiguous most-significant bits of the timestamp portions being compared.

EC105) The tangible computer readable medium of EC103, wherein if a particular one of the storage unit timestamp portions being compared is numerically identical to a particular one of the map unit timestamp portions being compared, then the comparing is determined by a predetermination that, when timestamp portions are identical, the storage unit timestamp portion being compared is earlier than the map unit timestamp portion being compared.

EC106) The tangible computer readable medium of EC105, wherein the numerical identity ignores one or more contiguous most-significant bits of the timestamp portions being compared.

EC107) The tangible computer readable medium of EC82, wherein each of the entry portions is in accordance with all of the data portions having corresponding timestamp portions that are earlier, according to the temporal order, than the corresponding timestamp portion of the respective entry portion.

EC108) The tangible computer readable medium of EC82, wherein each of the storage units is written atomically.

EC109) The tangible computer readable medium of EC82, wherein each of the map units is written atomically.

EC110) The tangible computer readable medium of EC82, wherein at least one of the data portions comprises host data from a host in association with a host data write command.

EC111) The tangible computer readable medium of EC82, wherein at least one of the data portions comprises recycled data read from the NVM in response to a recycling operation.

EC112) The tangible computer readable medium of EC82, wherein each of the data portions comprises respective one or more data units and respective corresponding one or more headers, each of the headers identifying a respective mapping between a respective corresponding one of the data units and one of the LBs, and the mappings enabling determining where respective ones of the LBs are written in the NVM as respective ones of the data units.

EC113) The tangible computer readable medium of EC112, wherein each of the headers is written contiguously in the NVM with the respective data unit identified by the respective header.

EC114) The tangible computer readable mediums of EC61, EC68, EC102, or EC110, wherein the operations further comprise interfacing with the host in accordance with the data writes.

EC115) The tangible computer readable medium of EC114, wherein the interfacing is compatible with a storage interface standard.

EC116) The tangible computer readable mediums of EC61, EC68, EC102, or EC110, wherein the host is a computing host, and wherein the computing host is operated in accordance with the data writes.

EC117) The tangible computer readable mediums of EC60, EC64, or EC82, wherein the NVM comprises one or more flash memories.

EC118) The tangible computer readable medium of EC117, wherein the operations further comprise interfacing with the flash memories via a flash memory interface.

EC119) An apparatus comprising:
first hardware logic circuitry enabled to arrange a series of data units in a Non-Volatile Memory (NVM) in a first order, each of the data units associated with a respective one of a plurality of timestamps;
second hardware logic circuitry enabled to arrange a series of data map units in the NVM in a second order, each of the data map units associated with a respective one of the timestamps;
wherein each of the data map units comprises a location in the NVM of a corresponding one of the data units; and
wherein the respective timestamp associated with each of the data units is at or before the respective timestamp associated with the corresponding data map unit.

EC120) The apparatus of EC119, wherein at least a portion of the first hardware logic circuitry is shared hardware logic circuitry that is also at least a portion of the second hardware logic circuitry:

EC121) The apparatus of EC119, wherein:
each of the data units corresponds to a respective data write from a host to a respective Logical Block Address (LBA);
a prior one and a subsequent one of the data units correspond to ones of the data writes to a same one of the respective LBAs; and
the prior data unit does not have an associated one of the data map units.

EC122) The apparatus of EC119, further comprising:
third hardware logic circuitry enabled to determine, subsequent to a power failure, a latest valid and contiguous one of the data units;
fourth hardware logic circuitry enabled to determine, subsequent to the power failure, a latest valid and contiguous one of the data map units wherein the respective timestamp associated with the latest valid and contiguous one of the data map units is at or before the respective timestamp associated with the latest valid and contiguous one of the data units;
fifth hardware logic circuitry enabled to recover only ones of the data map units up to the latest valid and contiguous one of the data map units; and
whereby any of the data map units associated with any of the respective timestamps after the respective timestamp associated with the latest valid and contiguous one of the data units are ignored in recovery.

EC123) The apparatus of EC119, wherein the data units are data storage units.

EC124) An apparatus comprising:
first hardware logic circuitry enabled to write a series of data storage units in a Non-Volatile Memory (NVM), each of the data storage units associated with a respective one of a plurality of timestamps;
second hardware logic circuitry enabled to write a series of data map units in the NVM, each of the data map units associated with a respective one of the timestamps;
wherein each of the data map units comprises a location in the NVM of a corresponding one of the data storage units; and
wherein the respective timestamp associated with each of the data storage units indicates a relative age that is identical to or older than a relative age indicated by the respective timestamp associated with the corresponding data map unit.

EC125) The apparatus of EC124, wherein at least a portion of the first hardware logic circuitry is shared hardware logic circuitry that is also at least a portion of the second hardware logic circuitry:

EC126) The apparatus of EC124, wherein the writing of the data storage units is in accordance with a first order and the writing of the data map units is in accordance with a second order.

EC127) The apparatus of EC124, wherein the data storage units are arranged in accordance with a first order in the NVM and the data map units are arranged in accordance with a second order in the NVM.

EC128) The apparatus of EC124, wherein:
a first one of the data storage units corresponds to a first data write from a host to a particular Logical Block Address (LBA);
a second one of the data storage units corresponds to a second data write from the host to the particular LBA;
the first data write precedes, in time order, the second data write; and
none of the data map units correspond to the first data storage unit.

EC129) The apparatus of EC126, further comprising:
third hardware logic circuitry enabled to determine, subsequent to an event and in accordance with the first order, a latest valid and contiguous one of the data storage units;
fourth hardware logic circuitry enabled to determine, subsequent to the event and in accordance with the second order, a latest valid and contiguous one of the data map units associated with a one of the respective timestamps indicating a relative age that is identical to or older than a relative age indicated by the respective timestamp associated with the latest valid and contiguous one of the data storage units; and fifth hardware logic circuitry enabled to recover, in accordance with the first and the second orders, only ones of the data map units up to the latest valid and contiguous one of the data map units.

EC130) An apparatus comprising:

first hardware logic circuitry enabled to write a plurality of storage units to a Non-Volatile Memory (NVM) in accordance with a storage stream, each of the storage units comprising a data portion and a corresponding timestamp portion;

second hardware logic circuitry enabled to write a plurality of map units to the NVM in accordance with a map stream, each of the map units comprising an entry portion and a corresponding timestamp portion;

wherein each of at least some of the entry portions enable determining where respective Logical Blocks (LBs) are written in the NVM by specifying at least a corresponding one of the data portions;

wherein a temporal order is indicated by the timestamp portions, the storage unit timestamp portions are monotonically increasing according to a timestamp order with respect to each other, and the map unit timestamp portions are monotonically increasing according to the timestamp order with respect to each other; and wherein there is at least one particular point in time when at least one of the map units written to the NVM has a timestamp portion that is later, according to the temporal order, than the latest, according to the temporal order, of the storage unit timestamp portions written to the NVM at the particular point in time.

EC131) The apparatus of EC130, wherein at least a portion of the first hardware logic circuitry is shared hardware logic circuitry that is also at least a portion of the second hardware logic circuitry:

EC132) The apparatus of EC130, wherein the first hardware logic circuitry writes the storage units in a time order corresponding to the temporal order as indicated by the storage unit timestamp portions, and the second hardware logic circuitry writes the map units in a time order corresponding to the temporal order as indicated by the map unit timestamp portions.

EC133) The apparatus of EC130, further comprising third hardware logic circuitry enabled to write one or more checkpoint units to the NVM in accordance with a checkpoint stream, each of the checkpoint units comprising a map portion and a corresponding timestamp portion, and wherein the checkpoint timestamp portions are monotonically increasing according to the timestamp order with respect to each other.

EC134) The apparatus of EC133, wherein the third hardware logic circuitry writes the checkpoint units in time order corresponding to the temporal order as indicated by the checkpoint timestamp portions.

EC135) The apparatus of EC133, wherein a contiguous group of a predetermined number of the checkpoint units comprises at least an entire checkpoint of a map that the entry portions are in accordance with.

EC136) Any of the foregoing ECs having or referring to a storage interface standard, wherein the storage interface standard comprises one or more of a Universal Serial Bus (USB) interface standard,
a Compact Flash (CF) interface standard,
a MultiMediaCard (MMC) interface standard,
an embedded MMC (eMMC) interface standard,
a Thunderbolt interface standard,
a UFS interface standard,
a Secure Digital (SD) interface standard,
a Memory Stick interface standard,
an xD-picture card interface standard,
an Integrated Drive Electronics (IDE) interface standard,
a Serial Advanced Technology Attachment (SATA) interface standard,
an external SATA (eSATA) interface standard,
a Small Computer System Interface (SCSI) interface standard,
a Serial Attached Small Computer System Interface (SAS) interface standard,
a Fibre Channel interface standard,
an Ethernet interface standard, and
a Peripheral Component Interconnect express (PCIe) interface standard.

EC137) Any of the foregoing ECs having or referring to a flash memory interface, wherein the flash memory interface is compatible with one or more of an Open NAND Flash Interface (ONFI),
a Toggle-mode interface,
a Double-Data-Rate (DDR) synchronous interface,
a DDR2 synchronous interface;
a synchronous interface, and
an asynchronous interface.

EC138) Any of the foregoing ECs having or referring to a computing host, wherein the computing host comprises one or more of a computer,
a workstation computer,
a server computer,
a storage server,
a Storage Attached Network (SAN),
a Network Attached Storage (NAS) device,
a Direct Attached Storage (DAS) device,
a storage appliance,
a Personal Computer (PC),
a laptop computer,
a notebook computer,
a netbook computer,
a tablet device or computer,
an ultrabook computer,
an electronic reading device (an e-reader),
a Personal Digital Assistant (PDA),
a navigation system,
a (handheld) Global Positioning System (GPS) device,
an automotive control system,
an automotive media control system or computer,
a printer, copier or fax machine or all-in-one device,
a Point Of Sale (POS) device,
a cash-register,
a media player,
a television,
a media recorder,
a Digital Video Recorder (DVR),
a digital camera,
a cellular handset,
a cordless telephone handset, and
an electronic game.

EC139) Any of the foregoing ECs having or referring to at least one flash memory, wherein at least a portion of the at least one flash memory comprises one or more of NAND flash technology storage cells, and
NOR flash technology storage cells.

EC140) Any of the foregoing ECs having or referring to at least one flash memory, wherein at least a portion of the at least one flash memory comprises one or more of Single-Level Cell (SLC) flash technology storage cells, and Multi-Level Cell (MLC) flash technology storage cells.

EC141) Any of the foregoing ECs having or referring to at least one flash memory, wherein at least a portion of the at least one flash memory comprises one or more of polysilicon technology-based charge storage cells, and silicon nitride technology-based charge storage cells.

EC142) Any of the foregoing ECs having or referring to at least one flash memory, wherein at least a portion of the at least one flash memory comprises one or more of two-dimensional technology-based flash memory technology, and three-dimensional technology-based flash memory technology.

System

In some embodiments, an I/O device, such as an SSD, includes an SSD controller. The SSD controller acts as a bridge between the host interface and NVM of the SSD, and executes commands of a host protocol sent from a computing host via a host interface of the SSD. At least some of the commands direct the SSD to write and read the NVM with data sent from and to the computing host, respectively. In further embodiments, the SSD controller is enabled to use a map to translate between LBAs of the host protocol and physical storage addresses in the NVM. In further embodiments, at least a portion of the map is used for private storage (not visible to the computing host) of the I/O device. For example, a portion of the LBAs not accessible by the computing host is used by the I/O device to manage access to logs, statistics, or other private data.

In some embodiments, accessing compressed data of varying-sized quanta in NVM provides improved storage efficiency in some usage scenarios. For example, an SSD controller receives (uncompressed) data from a computing host (e.g., relating to a disk write command), compresses the data, and stores the compressed data into flash memory. In response to a subsequent request from the computing host (e.g., relating to a disk read command), the SSD controller reads the compressed data from the flash memory, uncompresses the compressed data, and provides the uncompressed data to the computing host. The compressed data is stored in the flash memory according to varying-sized quanta, the quanta size varying due to, e.g., compression algorithm, operating mode, and compression effectiveness on various data. The SSD controller uncompresses the data in part by consulting an included map table to determine where header(s) are stored in the flash memory. The SSD controller parses the header(s) obtained from the flash memory to determine where appropriate (compressed) data is stored in the flash memory. The SSD controller uncompresses the appropriate data from the flash memory to produce the uncompressed data to provide to the computing host. In the instant application, uncompress (and variants thereof) is synonymous with decompress (and variants thereof).

In various embodiments, an SSD controller includes a host interface for interfacing with a computing host, an interface for interfacing with NVM such as flash memory, and circuitry for controlling the interfaces and performing (and/or controlling various aspects of the performing) compressing and uncompressing, as well as lower-level redundancy and/or error correction, higher-level redundancy and/or error correction, and dynamic higher-level redundancy mode management with independent silicon elements.

According to various embodiments, some host interfaces are compatible with one or more of a USB interface standard, a CF interface standard, an MMC interface standard, an eMMC interface standard, a Thunderbolt interface standard, a UFS interface standard, an SD interface standard, a Memory Stick interface standard, an xD-picture card interface standard, an IDE interface standard, a SATA interface standard, a SCSI interface standard, a SAS interface standard, and a PCIe interface standard. According to various embodiments, the computing host is all or any portions of a computer, a workstation computer, a server computer, a storage server, a SAN, a NAS device, a DAS device, a storage appliance, a PC, a laptop computer, a notebook computer, a netbook computer, a tablet device or computer, an ultrabook computer, an electronic reading device (such as an e-reader), a PDA, a navigation system, a (handheld) GPS device, an automotive control system, an automotive media control system or computer, a printer, copier or fax machine or all-in-one device, a POS device, a cash-register, a media player, a television, a media recorder, a DVR, a digital camera, a cellular handset, a cordless telephone handset, and an electronic game. In some embodiments, an interfacing host (such as a SAS/SATA bridge) operates as a computing host and/or as a bridge to a computing host.

In various embodiments, the SSD controller includes one or more processors. The processors execute firmware to control and/or perform operation of the SSD controller. The SSD controller communicates with the computing host to send and receive commands and/or status as well as data. The computing host executes one or more of an operating system, a driver, and an application. Communication by the computing host with the SSD controller is optionally and/or selectively via the driver and/or via the application. In a first example, all communication to the SSD controller is via the driver, and the application provides higher-level commands to the driver that the driver translates into specific commands for the SSD controller. In a second example, the driver implements a bypass mode and the application is enabled to send specific commands to the SSD controller via the driver. In a third example, a PCIe SSD controller supports one or more Virtual Functions (VFs), enabling an application, once configured, to communicate directly with the SSD controller, bypassing the driver.

According to various embodiments, some SSDs are compatible with form-factors, electrical interfaces, and/or protocols used by magnetic and/or optical non-volatile storage, such as HDDs, CD drives, and DVD drives. In various embodiments, SSDs use various combinations of zero or more parity codes, zero or more RS codes, zero or more BCH codes, zero or more Viterbi or other trellis codes, and zero or more LDPC codes.

FIG. 1A illustrates selected details of an embodiment of SSD 101 including an SSD controller using self-journaling and hierarchical consistency for managing non-volatile storage, such as flash memories. The SSD controller is for managing non-volatile storage, such as implemented via NVM elements (e.g., flash memories). SSD Controller 100 is communicatively coupled via one or more External Interfaces 110 to a host (not illustrated). According to various embodiments, External Interfaces 110 are one or more of: a SATA interface; a SAS interface; a PCIe interface; a Fibre Channel interface; an Ethernet Interface (such as 10 Gigabit Ethernet); a non-standard version of any of the preceding interfaces; a custom interface; or any other type of interface used to interconnect storage and/or communications and/or computing devices. For example, in some embodiments, SSD Controller 100 includes a SATA interface and a PCIe interface.

SSD Controller 100 is further communicatively coupled via one or more Device Interfaces 190 to NVM 199 including one or more storage devices, such as one or more instances of Flash Device 192. According to various embodiments, Device Interfaces 190 are one or more of: an asynchronous interface; a synchronous interface; a single-data-rate (SDR) interface; a double-data-rate (DDR) interface; a DRAM-compatible DDR or DDR2 synchronous interface; an ONFI compatible interface, such as an ONFI 2.2 or ONFI 3.0 compatible interface; a Toggle-mode compatible flash interface; a non-standard version of any of the preceding interfaces; a custom interface; or any other type of interface used to connect to storage devices.

Each of Flash Device 192 has, in some embodiments, one or more individual Flash Die 194. According to type of a particular one of Flash Device 192, a plurality of Flash Die 194 in the particular Flash Device 192 is optionally and/or selectively accessible in parallel. Flash Device 192 is merely representative of one type of storage device enabled to communicatively couple to SSD Controller 100. In various embodiments, any type of storage device is usable, such as an SLC NAND flash memory, MLC NAND flash memory, NOR flash memory, flash memory using polysilicon or silicon nitride technology-based charge storage cells, two- or three-dimensional technology-based flash memory, read-only memory, static random access memory, dynamic random access memory, ferromagnetic memory, phase-change memory, racetrack memory, ReRAM, or any other type of memory device or storage medium.

According to various embodiments, Device Interfaces 190 are organized as: one or more busses with one or more instances of Flash Device 192 per bus; one or more groups of busses with one or more instances of Flash Device 192 per bus, having busses in a group generally accessed in parallel; or any other organization of one or more instances of Flash Device 192 onto Device Interfaces 190.

Continuing in FIG. 1A, SSD Controller 100 has one or more modules, such as Host Interfaces 111, Data Processing 121, Buffer 131, Map 141, Recycler 151, ECC 161, Device Interface Logic 191, and CPU 171. The specific modules and interconnections illustrated in FIG. 1A are merely representative of one embodiment, and many arrangements and interconnections of some or all of the modules, as well as additional modules not illustrated, are conceived. In a first example, in some embodiments, there are two or more Host Interfaces 111 to provide dual-porting. In a second example, in some embodiments, Data Processing 121 and/or ECC 161 are combined with Buffer 131. In a third example, in some embodiments, Host Interfaces 111 is directly coupled to Buffer 131, and Data Processing 121 optionally and/or selectively operates on data stored in Buffer 131. In a fourth example, in some embodiments, Device Interface Logic 191 is directly coupled to Buffer 131, and ECC 161 optionally and/or selectively operates on data stored in Buffer 131.

Host Interfaces 111 sends and receives commands and/or data via External Interfaces 110, and, in some embodiments, tracks progress of individual commands via Tag Tracking 113. For example, the commands include a read command specifying an address (such as an LBA) and an amount of data (such as a number of LBA quanta, e.g., sectors) to read; in response the SSD provides read status and/or read data. For another example, the commands include a write command specifying an address (such as an LBA) and an amount of data (such as a number of LBA quanta, e.g., sectors) to write; in response the SSD provides write status and/or requests write data and optionally subsequently provides write status. For yet another example, the commands include a de-allocation command (e.g. a trim command) specifying one or more addresses (such as one or more LBAs) that no longer need be allocated; in response the SSD modifies the Map accordingly and optionally provides de-allocation status. In some contexts an ATA compatible TRIM command is an exemplary de-allocation command. For yet another example, the commands include a super capacitor test command or a data hardening success query; in response, the SSD provides appropriate status. In some embodiments, Host Interfaces 111 is compatible with a SATA protocol and, using NCQ commands, is enabled to have up to 32 pending commands, each with a unique tag represented as a number from 0 to 31. In some embodiments, Tag Tracking 113 is enabled to associate an external tag for a command received via External Interfaces 110 with an internal tag used to track the command during processing by SSD Controller 100.

According to various embodiments, one or more of: Data Processing 121 optionally and/or selectively processes some or all data sent between Buffer 131 and External Interfaces 110; and Data Processing 121 optionally and/or selectively processes data stored in Buffer 131. In some embodiments, Data Processing 121 uses one or more Engines 123 to perform one or more of: formatting; reformatting; transcoding; and any other data processing and/or manipulation task.

Buffer 131 stores data sent to/from External Interfaces 110 from/to Device Interfaces 190. In some embodiments, Buffer 131 additionally stores system data, such as some or all map tables, used by SSD Controller 100 to manage one or more instances of Flash Device 192. In various embodiments, Buffer 131 has one or more of: Memory 137 used for temporary storage of data; DMA 133 used to control movement of data to and/or from Buffer 131; and ECC-X 135 used to provide higher-level error correction and/or redundancy functions; and other data movement and/or manipulation functions. An example of a higher-level redundancy function is a RAID-like capability (e.g. RASIE), with redundancy at a flash device level (e.g., multiple ones of Flash Device 192) and/or a flash die level (e.g., Flash Die 194) instead of at a disk level.

According to various embodiments, one or more of: ECC 161 optionally and/or selectively processes some or all data sent between Buffer 131 and Device Interfaces 190; and ECC 161 optionally and/or selectively processes data stored in Buffer 131. In some embodiments, ECC 161 is used to provide lower-level error correction and/or redundancy functions, such as in accordance with one or more ECC techniques. In some embodiments, ECC 161 implements one or more of: a CRC code; a Hamming code; an RS code; a BCH code; an LDPC code; a Viterbi code; a trellis code; a hard-decision code; a soft-decision code; an erasure-based code; any error detecting and/or correcting code; and any combination of the preceding. In some embodiments, ECC 161 includes one or more decoders (such as LDPC decoders).

Device Interface Logic 191 controls instances of Flash Device 192 via Device Interfaces 190. Device Interface Logic 191 is enabled to send data to/from the instances of Flash Device 192 according to a protocol of Flash Device 192. Device Interface Logic 191 includes Scheduling 193 to selectively sequence control of the instances of Flash Device 192 via Device Interfaces 190. For example, in some embodiments, Scheduling 193 is enabled to queue operations to the instances of Flash Device 192, and to selectively send the operations to individual ones of the instances of Flash Device 192 (or Flash Die 194) as individual ones of the instances of Flash Device 192 (or Flash Die 194) are available.

Map 141 converts between data addressing used on External Interfaces 110 and data addressing used on Device Interfaces 190, using Table 143 to map external data addresses to locations in NVM 199. For example, in some embodiments, Map 141 converts LBAs used on External Interfaces 110 to block and/or page addresses targeting one or more Flash Die 194, via mapping provided by Table 143. For LBAs that have never been written since drive manufacture or de-allocation, the Map points to a default value to return if the LBAs are read. For example, when processing a de-allocation command, the Map is modified so that entries corresponding to the de-allocated LBAs point to one of the default values. In various embodiments, there are various default values, each having a corresponding pointer. The plurality of default values enables reading some de-allocated LBAs (such as in a first range) as one default value, while reading other de-allocated LBAs (such as in a second range) as another default value. The default values, in various embodiments, are defined by flash memory, hardware, firmware, command and/or primitive arguments and/or parameters, programmable registers, or various combinations thereof.

In some embodiments, Map 141 uses Table 143 to perform and/or to look up translations between addresses used on External Interfaces 110 and data addressing used on Device Interfaces 190. According to various embodiments, Table 143 is one or more of: a one-level map; a two-level map; a multi-level map; a map cache; a compressed map; any type of mapping from one address space to another; and any combination of the foregoing. According to various embodiments, Table 143 includes one or more of: static random access memory; dynamic random access memory; NVM (such as flash memory); cache memory; on-chip memory; off-chip memory; and any combination of the foregoing.

In some embodiments, Recycler 151 performs garbage collection. For example, in some embodiments, instances of Flash Device 192 contain blocks that must be erased before the blocks are re-writeable. Recycler 151 is enabled to determine which portions of the instances of Flash Device 192 are actively in use (e.g., allocated instead of de-allocated), such as by scanning a map maintained by Map 141, and to make unused (e.g., de-allocated) portions of the instances of Flash Device 192 available for writing by erasing the unused portions. In further embodiments, Recycler 151 is enabled to move data stored within instances of Flash Device 192 to make larger contiguous portions of the instances of Flash Device 192 available for writing.

In some embodiments, instances of Flash Device 192 are selectively and/or dynamically configured, managed, and/or used to have one or more bands for storing data of different types and/or properties. A number, arrangement, size, and type of the bands are dynamically changeable. For example, data from a computing host is written into a hot (active) band, while data from Recycler 151 is written into a cold (less active) band. In some usage scenarios, if the computing host writes a long, sequential stream, then a size of the hot band grows, whereas if the computing host does random writes or few writes, then a size of the cold band grows.

CPU 171 controls various portions of SSD Controller 100. CPU 171 includes CPU Core 172. CPU Core 172 is, according to various embodiments, one or more single-core or multi-core processors. The individual processors cores in CPU Core 172 are, in some embodiments, multi-threaded. CPU Core 172 includes instruction and/or data caches and/or memories. For example, the instruction memory contains instructions to enable CPU Core 172 to execute programs (e.g. software sometimes called firmware) to control SSD Controller 100. In some embodiments, some or all of the firmware executed by CPU Core 172 is stored on instances of Flash Device 192 (as illustrated, e.g., as Firmware 106 of NVM 199 in FIG. 1B).

In various embodiments, CPU 171 further includes: Command Management 173 to track and control commands received via External Interfaces 110 while the commands are in progress; Buffer Management 175 to control allocation and use of Buffer 131; Translation Management 177 to control Map 141; Coherency Management 179 to control consistency of data addressing and to avoid conflicts such as between external data accesses and recycle data accesses; Device Management 181 to control Device Interface Logic 191; Identity Management 182 to control modification and communication of identify information, and optionally other management units. None, any, or all of the management functions performed by CPU 171 are, according to various embodiments, controlled and/or managed by hardware, by software (such as firmware executing on CPU Core 172 or on a host connected via External Interfaces 110), or any combination thereof.

In some embodiments, CPU 171 is enabled to perform other management tasks, such as one or more of: gathering and/or reporting performance statistics; implementing SMART; controlling power sequencing, controlling and/or monitoring and/or adjusting power consumption; responding to power failures; controlling and/or monitoring and/or adjusting clock rates; and other management tasks.

Various embodiments include a computing-host flash memory controller that is similar to SSD Controller 100 and is compatible with operation with various computing hosts, such as via adaptation of Host Interfaces 111 and/or External Interfaces 110. The various computing hosts include one or any combination of a computer, a workstation computer, a server computer, a storage server, a SAN, a NAS device, a DAS device, a storage appliance, a PC, a laptop computer, a notebook computer, a netbook computer, a tablet device or computer, an ultrabook computer, an electronic reading device (such as an e-reader), a PDA, a navigation system, a (handheld) GPS device, an automotive control system, an automotive media control system or computer, a printer, copier or fax machine or all-in-one device, a POS device, a cash-register, a media player, a television, a media recorder, a DVR, a digital camera, a cellular handset, a cordless telephone handset, and an electronic game.

In various embodiments, all or any portions of an SSD controller (or a computing-host flash memory controller) are implemented on a single IC, a single die of a multi-die IC, a plurality of dice of a multi-die IC, or a plurality of ICs. For example, Buffer 131 is implemented on a same die as other elements of SSD Controller 100. For another example, Buffer 131 is implemented on a different die than other elements of SSD Controller 100.

Figure 1B:
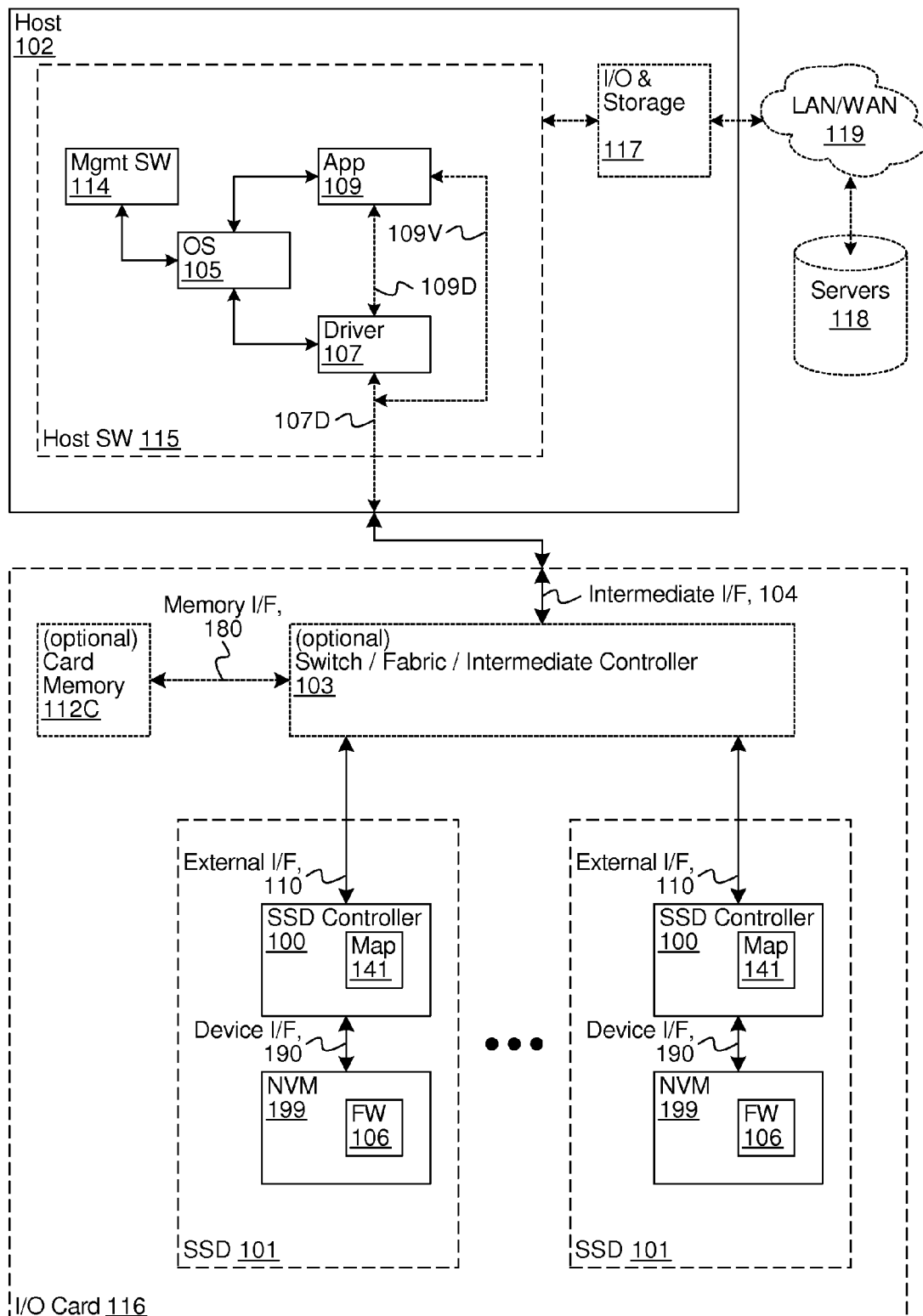
FIG. 1B illustrates selected details of various embodiments of systems including one or more instances of the SSD of FIG. 1A.

FIG. 1B illustrates selected details of various embodiments of systems including one or more instances of the SSD of FIG. 1A. SSD 101 includes SSD Controller 100 coupled to NVM 199 via Device Interfaces 190. The figure illustrates various classes of embodiments: a single SSD coupled directly to a host, a plurality of SSDs each respectively coupled directly to a host via respective external interfaces, and one or more SSDs coupled indirectly to a host via various interconnection elements.

As an example embodiment of a single SSD coupled directly to a host, one instance of SSD 101 is coupled directly to Host 102 via External Interfaces 110 (e.g. Switch/Fabric/Intermediate Controller 103 is omitted, bypassed, or passed-through). As an example embodiment of a plurality of SSDs each coupled directly to a host via respective external interfaces, each of a plurality of instances of SSD 101 is respectively coupled directly to Host 102 via a respective instance of External Interfaces 110 (e.g. Switch/Fabric/Intermediate Controller 103 is omitted, bypassed, or passed-through). As an example embodiment of one or more SSDs coupled indirectly to a host via various interconnection elements, each of one or more instances of SSD 101 is respectively coupled indirectly to Host 102. Each indirect coupling is via a respective instance of External Interfaces 110 coupled to Switch/Fabric/Intermediate Controller 103, and Intermediate Interfaces 104 coupling to Host 102.

Some of the embodiments including Switch/Fabric/Intermediate Controller 103 also include Card Memory 112C coupled via Memory Interface 180 and accessible by the SSDs. In various embodiments, one or more of the SSDs, the Switch/Fabric/Intermediate Controller, and/or the Card Memory are included on a physically identifiable module, card, or pluggable element (e.g. I/O Card 116). In some embodiments, SSD 101 (or variations thereof) corresponds to a SAS drive or a SATA drive that is coupled to an initiator operating as Host 102.

Host 102 is enabled to execute various elements of Host Software 115, such as various combinations of OS 105, Driver 107, Application 109, and Multi-Device Management Software 114. Dotted-arrow 107D is representative of Host Software←→I/O Device Communication, e.g. data sent/received to/from one or more of the instances of SSD 101 and from/to any one or more of OS 105 via Driver 107, Driver 107, and Application 109, either via Driver 107, or directly as a VF.

OS 105 includes and/or is enabled to operate with drivers (illustrated conceptually by Driver 107) for interfacing with the SSD. Various versions of Windows (e.g. 95, 98, ME, NT, XP, 2000, Server, Vista, and 7), various versions of Linux (e.g. Red Hat, Debian, and Ubuntu), and various versions of MacOS (e.g. 8, 9 and X) are examples of OS 105. In various embodiments, the drivers are standard and/or generic drivers (sometimes termed "shrink-wrapped" or "pre-installed") operable with a standard interface and/or protocol such as SATA, AHCI, or NVM Express, or are optionally customized and/or vendor specific to enable use of commands specific to SSD 101. Some drives and/or drivers have pass-through modes to enable application-level programs, such as Application 109 via Optimized NAND Access (sometimes termed ONA) or Direct NAND Access (sometimes termed DNA) techniques, to communicate commands directly to SSD 101, enabling a customized application to use commands specific to SSD 101 even with a generic driver. ONA techniques include one or more of: use of non-standard modifiers (hints); use of vendor-specific commands; communication of non-standard statistics, such as actual NVM usage according to compressibility; and other techniques. DNA techniques include one or more of: use of non-standard commands or vendor-specific providing unmapped read, write, and/or erase access to the NVM; use of non-standard or vendor-specific commands providing more direct access to the NVM, such as by bypassing formatting of data that the I/O device would otherwise do; and other techniques. Examples of the driver are a driver without ONA or DNA support, an ONA-enabled driver, a DNA-enabled driver, and an ONA/DNA-enabled driver. Further examples of the driver are a vendor-provided, vendor-developed, and/or vendor-enhanced driver, and a client-provided, client-developed, and/or client-enhanced driver.

Examples of the application-level programs are an application without ONA or DNA support, an ONA-enabled application, a DNA-enabled application, and an ONA/DNA-enabled application. Dotted-arrow 109D is representative of Application←→I/O Device Communication (e.g. bypass via a driver or bypass via a VF for an application), e.g. an ONA-enabled application and an ONA-enabled driver communicating with an SSD, such as without the application using the OS as an intermediary. Dotted-arrow 109V is representative of Application←→I/O Device Communication (e.g. bypass via a VF for an application), e.g. a DNA-enabled application and a DNA-enabled driver communicating with an SSD, such as without the application using the OS or the driver as intermediaries.

One or more portions of NVM 199 are used, in some embodiments, for firmware storage, e.g. Firmware 106. The firmware storage includes one or more firmware images (or portions thereof). A firmware image has, for example, one or more images of firmware, executed, e.g., by CPU Core 172 of SSD Controller 100. A firmware image has, for another example, one or more images of constants, parameter values, and NVM device information, referenced, e.g. by the CPU core during the firmware execution. The images of firmware correspond, e.g., to a current firmware image and zero or more previous (with respect to firmware updates) firmware images. In various embodiments, the firmware provides for generic, standard, ONA, and/or DNA operating modes. In some embodiments, one or more of the firmware operating modes are enabled (e.g. one or more APIs are "unlocked") via keys or various software techniques, optionally communicated and/or provided by a driver.

In some embodiments lacking the Switch/Fabric/Intermediate Controller, the SSD is coupled to the Host directly via External Interfaces 110. In various embodiments, SSD Controller 100 is coupled to the Host via one or more intermediate levels of other controllers, such as a RAID controller. In some embodiments, SSD 101 (or variations thereof) corresponds to a SAS drive or a SATA drive and Switch/Fabric/Intermediate Controller 103 corresponds to an expander that is in turn coupled to an initiator, or alternatively Switch/Fabric/Intermediate Controller 103 corresponds to a bridge that is indirectly coupled to an initiator via an expander. In some embodiments, Switch/Fabric/Intermediate Controller 103 includes one or more PCIe switches and/or fabrics.

In various embodiments, such as some of the embodiments with Host 102 as a computing host (e.g. a computer, a workstation computer, a server computer, a storage server, a SAN, a NAS device, a DAS device, a storage appliance, a PC, a laptop computer, a notebook computer, and/or a netbook computer), the computing host is optionally enabled to communicate (e.g. via optional I/O & Storage Devices/Resources 117 and optional LAN/WAN 119) with one or more local and/or remote servers (e.g. optional Servers 118). The communication enables, for example, local and/or remote access, management, and/or usage of any one or more of SSD 101 elements. In some embodiments, the communication is wholly or partially via Ethernet. In some embodiments, the communication is wholly or partially via Fibre Channel. LAN/WAN 119 is representative, in various embodiments, of one or more Local and/or Wide Area Networks, such as any one or more of a network in a server farm, a network coupling server farms, a metro-area network, and the Internet.

In various embodiments, an SSD controller and/or a computing-host flash memory controller in combination with one or more NVMs are implemented as a non-volatile storage component, such as a USB storage component, a CF storage component, an MMC storage component, an eMMC storage component, a Thunderbolt storage component, a UFS storage component, an SD storage component, a Memory Stick storage component, and an xD-picture card storage component.

In various embodiments, all or any portions of an SSD controller (or a computing-host flash memory controller), or functions thereof, are implemented in a host that the controller is to be coupled with (e.g., Host 102 of FIG. 1B). In various embodiments, all or any portions of an SSD controller (or a computing-host flash memory controller), or functions thereof, are implemented via hardware (e.g., logic circuitry), software and/or firmware (e.g., driver software and/or SSD control firmware), or any combination thereof. For example, functionality of or associated with an ECC unit (such as similar to ECC 161 and/or ECC-X 135 of FIG. 1A) is implemented partially via software on a host and partially via a combination of firmware and hardware in an SSD controller. For another example, functionality of or associated with a recycler unit (such as similar to Recycler 151 of FIG. 1A) is implemented partially via software on a host and partially via hardware in a computing-host flash memory controller.

Mapping Operation

Figure 2:
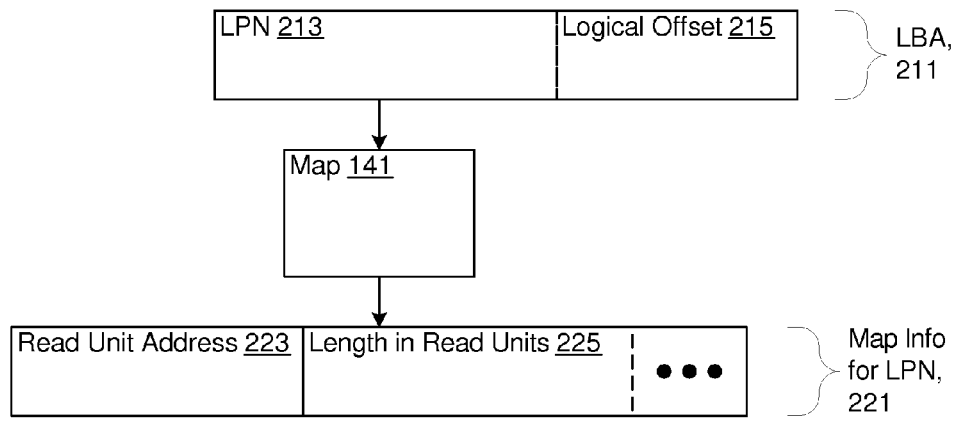
FIG. 2 illustrates selected details of an embodiment of mapping a Logical Page Number (LPN) portion of a Logical Block Address (LBA).

FIG. 2 illustrates selected details of an embodiment of mapping an LPN portion of an LBA. In some embodiments, a read unit is a finest granularity of an NVM that is independently readable, such as a portion of a page of the NVM. In further embodiments, the read unit corresponds to check bits (sometimes-termed redundancy) of a (lower-level) error-correcting code along with all data protected by the check bits. For example, ECC 161 of FIG. 1A implements error correction via check bits such as via an LDPC code, and a read unit corresponds to coding bits implementing the LDPC code in addition to data bits protected by the LDPC coding bits.

In some embodiments, Map 141 maps LPN 213 portion of LBA 211 to Map Info for LPN 221, such as via Table 143 (as illustrated in FIG. 1A). Map info for an LPN (such as Map Info for LPN 221) is sometimes termed a map entry. Map 141 is said to associate an LPN with a corresponding map entry. In various embodiments, mapping is via one or more associative look-ups, via one or more non-associative look-ups, and/or via one or more other techniques.

In some embodiments, SSD Controller 100 maintains one map entry for each LPN potentially and/or actively in use.

In some embodiments, Map Info for LPN 221 includes respective Read Unit Address 223 and Length in Read Units 225. In some embodiments, a length and/or a span are stored encoded, such as by storing the length as an offset from the span, e.g. in all or any portions of Length in Read Units 225. In further embodiments, a first LPN is associated with a first map entry, a second LPN (different from the first LPN, but referring to a logical page of a same size as a logical page referred to by the first LPN) is associated with a second map entry, and the respective length in read units of the first map entry is different from the respective length in read units of the second map entry.

In various embodiments, at a same point in time, a first LPN is associated with a first map entry, a second LPN (different from the first LPN) is associated with a second map entry, and the respective read unit address of the first map entry is the same as the respective read unit address of the second map entry. In further embodiments, data associated with the first LPN and data associated with the second LPN are both stored in a same physical page of a same device in NVM 199.

According to various embodiments, Read Unit Address 223 is associated with one or more of: a starting address in the NVM; an ending address in the NVM; an offset of any of the preceding; and any other techniques for identifying a portion of the NVM associated with LPN 213.

Figure 3:
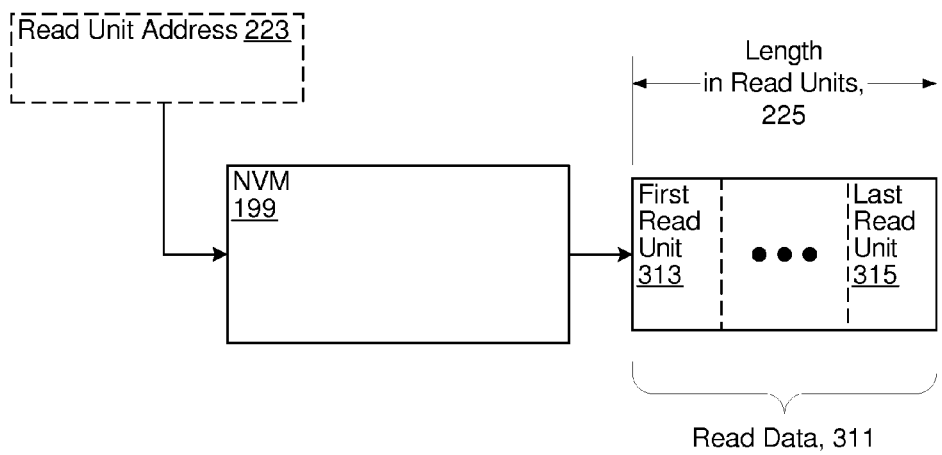
FIG. 3 illustrates selected details of an embodiment of accessing a Non-Volatile Memory (NVM) at a read unit address to produce read data organized as various read units, collectively having a length measured in quanta of read units.

FIG. 3 illustrates selected details of an embodiment of accessing an NVM at a read unit address to produce read data organized as various read units, collectively having a length measured in quanta of read units. According to various embodiments, First Read Unit 313 is one or more of: a one of read units in Read Data 311 with a lowest address in an address space of the NVM; a fixed one of the read units; an arbitrary one of the read units; a variable one of the read units; and a one of the read units selected by any other technique. In various embodiments, SSD Controller 100 is enabled to access NVM 199 and produce Read Data 311 by reading no more than a number of read units specified by Length in Read Units 225.

Figure 4A:
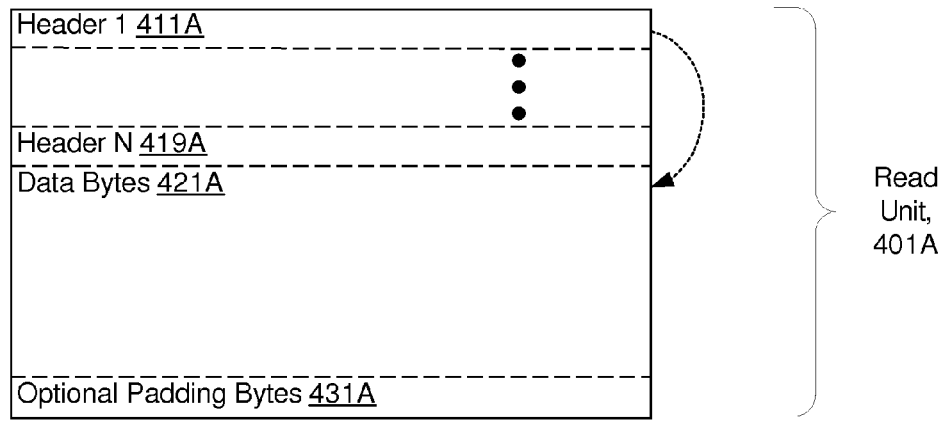
FIG. 4A illustrates selected details of an embodiment of a read unit.

FIG. 4A illustrates selected details of an embodiment of a read unit (such as Read Units 313 or 315 of FIG. 3) as Read Unit 401A. In various embodiments and/or usage scenarios, Header 1 411A through Header N 419A are contiguous, and respective data regions identified (such as via respective offsets) by each of the headers are contiguous following a last one of the headers. The data regions collectively form Data Bytes 421A. The data regions are stored in a location order that matches the location order the headers are stored. For example, consider a first header, at the beginning of a read unit, with a second header and a third header contiguously following the first header. A first data region (identified by a first offset in the first header) contiguously follows the third header. A second data region (identified by a second offset in the second header) contiguously follows the first data region. Similarly, a third data region (identified by the third header) contiguously follows the second data region.

Figure 4B:
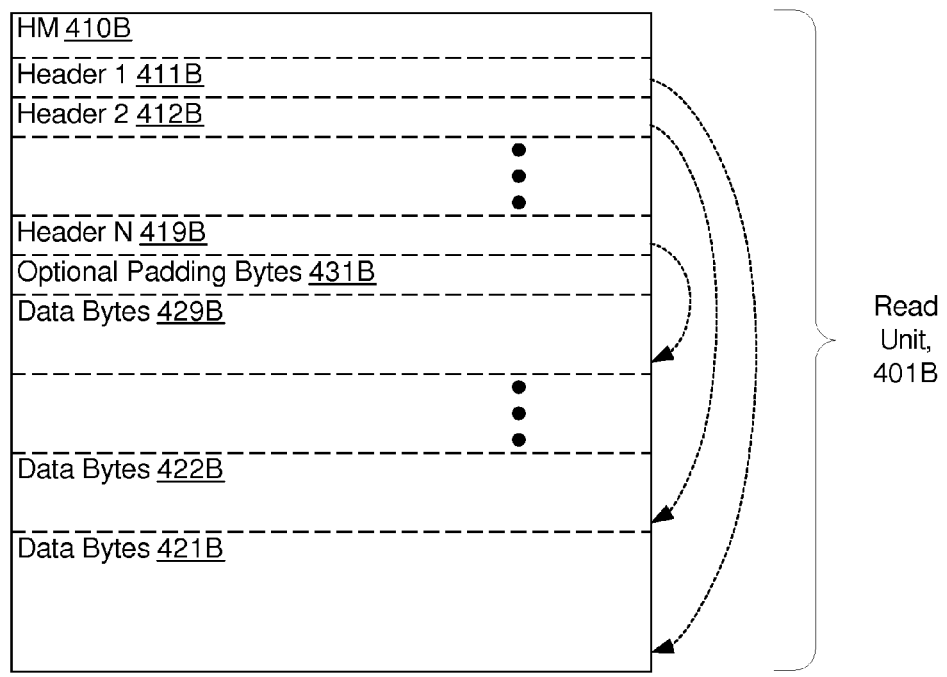
FIG. 4B illustrates selected details of another embodiment of a read unit.

FIG. 4B illustrates selected details of another embodiment of a read unit (such as Read Units 313 or 315 of FIG. 3) as Read Unit 401B. In various embodiments and/or usage scenarios, Header Marker (HM) 410B is an optional initial field (such as a one-byte field) indicating a number of following contiguous headers (Header 1 411B, Header 2 412B . . . Header N 419B). Data regions (Data Bytes 421B, Data Bytes 422B . . . Data Bytes 429B) are identified respectively by the headers (Header 1 411B, Header 2 412B . . . Header N 419B) and are stored in a location order that is opposite of the location order that the headers are stored. Headers start at the beginning of a read unit, while corresponding data regions start at the end of a read unit. In some embodiments, data bytes within a data region (e.g. Data Bytes 421B, Data Bytes 422B . . . Data Bytes 429B) are arranged in a forward order (byte order matching location order), while in other embodiments, the data bytes are arranged in a reverse order (byte order reversed with respect to location order). In some embodiments, a header marker is used in read units where headers and data bytes are stored in a same location order (e.g. as illustrated in FIG. 4A).

In some embodiments, Optional Padding Bytes 431A (or 431B) are according to granularity of data associated with a particular LPN. For example, in some embodiments, if Data Bytes 421A (or collectively Data Bytes 421B, Data Bytes 422B . . . Data Bytes 429B) have less than a fixed amount of remaining space, such as 8 bytes, after storing data associated with all but a last one of Header 1 411A through Header N 419A (or Header 1 411B, Header 2 412B . . . Header N 419B), then data for an LPN associated with the last header starts in a subsequent read unit. In further embodiments, a particular offset value (e.g. all ones) in the last header indicates that the data for the LPN associated with the last header starts in the subsequent read unit.

Figure 5:
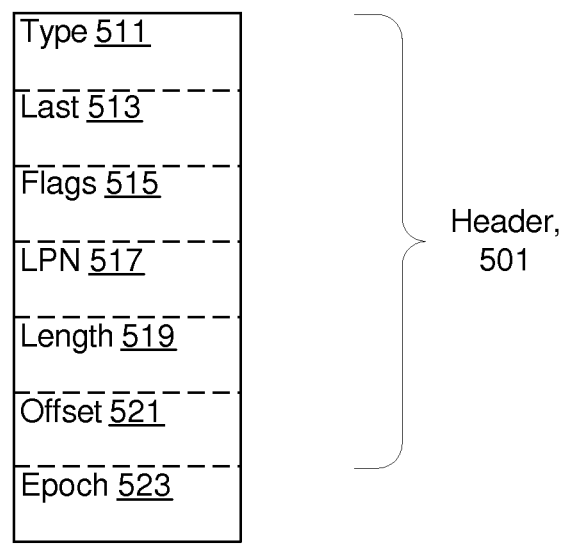
FIG. 5 illustrates selected details of an embodiment of a header having a number of fields.

FIG. 5 illustrates selected details of an embodiment of a header (such as any of Header 1 411A through Header N 419A of FIG. 4A or Header 1 411B through Header 419B of FIG. 4B) having a number of fields. In some embodiments, headers are fixed-length (e.g. each header is a same number of bytes long). Header 501 includes fields Type 511, Last Indicator 513, Flags 515, LPN 517, Length 519, and Offset 521. According to various embodiments, Header 501 includes and/or is associated with and/or is optionally and/or selectively appended or prepended with Epoch 523. The type field identifies a category of the data bytes. For example, the type field indicates the category of the data bytes is one of host data (e.g. logical page data) or system data (e.g. map information or checkpoint information). The last field indicates that the header is the last header before the data bytes. In some embodiments with a header marker, the last field is optionally omitted. The LPN field is the LPN that the header is associated with. The LPN field enables parsing of the headers to determine a particular one of the headers that is associated with a particular LPN by, for example, searching the headers for one with an LPN field matching the particular LPN. The length field is the length, in bytes, of the data bytes (e.g. how many bytes of data there are in Data Bytes 421A associated with Header 501). In some embodiments, an offset in the offset field is rounded according to a particular granularity (e.g. 8-byte granularity). The epoch field is a time marker that identifies a write order of an object the header is part of in relation to other objects of a same or different streams.

In various embodiments, some or all information associated with a particular LPN is stored in a map entry associated with the particular LPN, a header associated with the particular LPN, or both. For example, in some embodiments, some or all of Length 519 is stored in a map entry rather than in a header.

Figure 6:
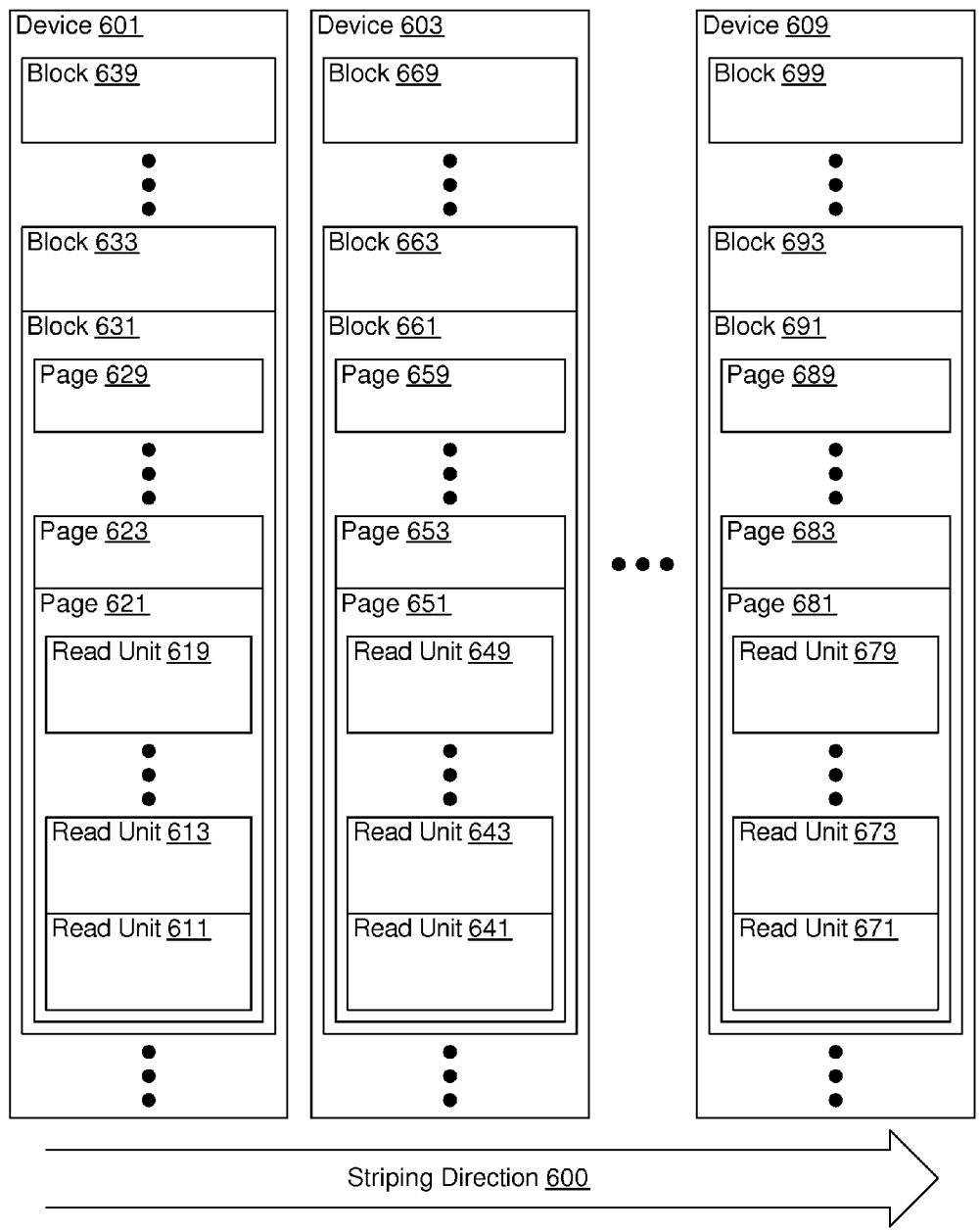
FIG. 6 illustrates selected details of an embodiment of blocks, pages, and read units of multiple NVM devices.

FIG. 6 illustrates selected details of an embodiment of blocks, pages, and read units of multiple NVM devices (e.g. one or more flash die and/or flash chips).

Each device (such as any one of Devices 601, 603 ... and 609) provides storage organized as blocks (such as Blocks 631, 633 ... and 639 of Device 601; Blocks 661, 663 ... and 669 of Device 603; and so forth). In some embodiments, each device includes an integral number of blocks and a block is a smallest quantum of erasing. The blocks in turn include pages (such as Pages 621, 623 ... and 629 of Block 631; Pages 651, 653 ... and 659 of Block 661; and so forth). In some embodiments, each block includes an integral number of pages and a page is a smallest quantum of writing. The pages in turn include read units (such as Read Units 611, 613 ... and 619 of Page 621; Read Units 641, 643 ... and 649 of Page 651; and so forth). According to various embodiments, one or more of: a read unit is a smallest quantum of reading and error correction; each page includes an integral number of read units; an associated group of two or more pages includes an integral number of read units; and read units optionally and/or selectively span page boundaries. Reads and/or writes of information in the devices are performed according to an order, such as a 'read unit first' order or a 'page first' order. An example of a read unit first order for read units illustrated in the figure begins with Read Unit 611 followed by 641, ..., 671, 613, 643, ..., 673, and so forth, ending with 679. An example of a page first order for read units illustrated in the figure begins with Read Unit 611 followed by 613, ..., 619, 641, 643, ..., 649, 671, 673, and so forth, ending with 679.

In various embodiments, Flash Die 601, 603 ... and 609 correspond to respective ones of one or more individual Flash Die 194, of FIG. 1A. In some embodiments, Devices 601, 603 ... and 609 are a portion less than all of NVM 199. For example, in various embodiments, data is striped independently across multiple groups of flash die, and each of the groups of flash die is independently accessible.

In some embodiments, various NVM management functions (e.g. any one or more of reading, recycling, erasing, programming/writing, and/or functions relating to using NVM) are performed in logical slices and/or sections, sometimes referred to as R-blocks. In various embodiments, an R-block is exemplified as a logical slice or section across various die (e.g. all die, all die excluding ones that are wholly or partially failed, and/or one or more selected subsets of die) of, e.g., a flash memory. For example, in a flash memory having R flash die, each flash die having N blocks, each R-block is the $i^{th}$ block from each of the flash die taken together, for a total of N R-blocks. For another example, in a flash memory having R flash die, each with N blocks, each R-block is the $i^{th}$ block and the $(i+1)^{th}$ block from each of the flash die, for a total of N/2 R-blocks. For yet another example, in a flash memory having a plurality of dual plane devices, each R-block is the $i^{th}$ even block and the $i^{th}$ odd block from each of the dual plane devices.

Other arrangements of flash die blocks for management as R-blocks are contemplated, including mapping between virtual and physical block addresses to ensure that R-blocks have one block from each die, even if some blocks are inoperable. In various embodiments, some of the N blocks in each flash die are used as spares so that the mapping between virtual and physical block addresses has spare (otherwise unused) blocks to replace defective ones of the blocks in the R-blocks.

Figure 7:
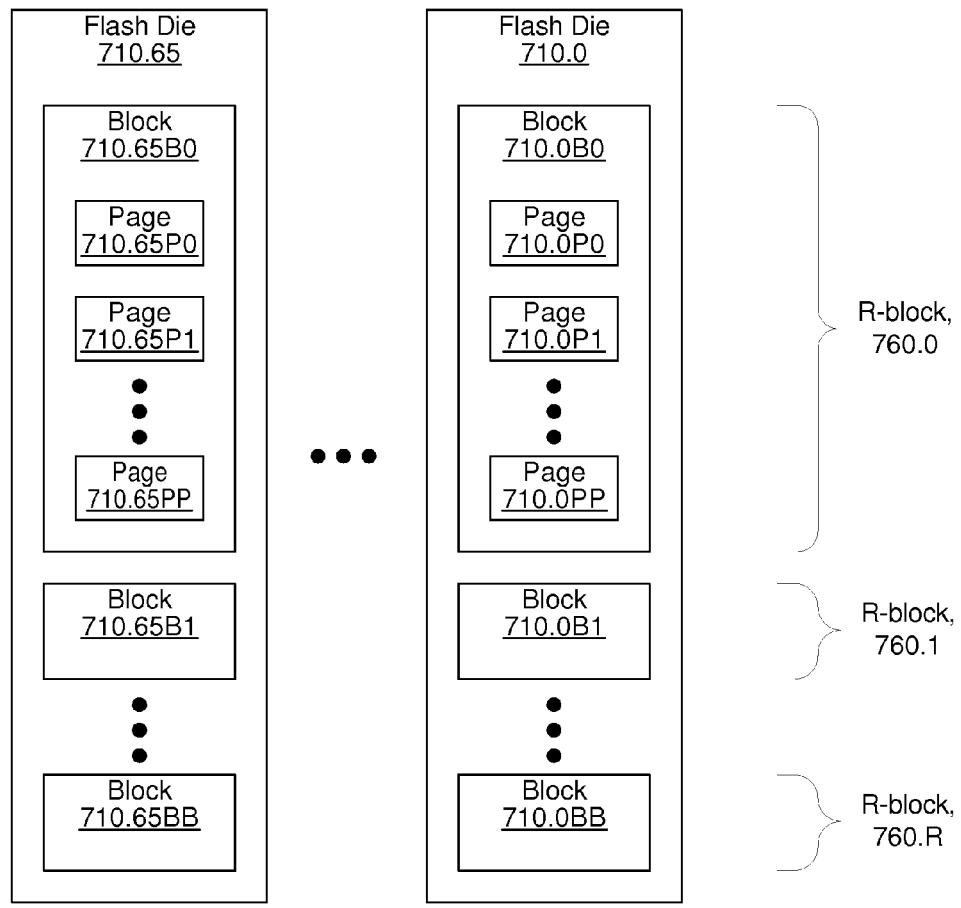
FIG. 7 illustrates selected details of an embodiment of R-blocks.

FIG. 7 illustrates selected details of an embodiment of R-blocks. The figure illustrates an embodiment with 66 flash die (Flash Die 710.65 ... 710.0). Blocks, pages, and management of the blocks as R-blocks are illustrated. Each flash die is illustrated as having N blocks (such as Block 710.65B0, Block 710.65B1 ... Block 710.65BB of Flash Die 710.65). A specific example of R-blocks is each R-block being the $i^{th}$ block from each of the flash die, taken together, such as R-block 760.0 being Block 710.65B0 from Flash Die 710.65, block 0 from Flash Die 710.64 (not explicitly illustrated), and so forth to Block 710.0B0 of Flash Die 710.0. There are thus a total of N R-blocks (R-block 760.0, R-block 760.1 ... R-block 760.R). Another specific example of R-blocks is each R-block being the $i^{th}$ and the $(i+1)^{th}$ block from each of the flash die, taken together (e.g. Block 710.65B0 and Block 710.65B1 from Flash Die 710.65, blocks 0 and 1 from Flash Die 710.64, and so forth to Block 710.0B0 and Block 710.0B1 from Flash Die 710.0). There are thus N/2 R-blocks, if there are N blocks in each flash die.

In various embodiments with blocks treated in pairs or other associated groups as part of forming an R-block, respective pages from each block of an associated group of the blocks are also treated as a unit, such as for writing, forming a larger multi-block page. For example, in various dual plane embodiments having even and odd blocks, a first page of a particular one of the even blocks and a first page of an associated one of the odd blocks are treated as a unit for writing, and optionally and/or selectively as a unit for reading. Similarly, a second page of the particular even block and a second page of the associated odd block are treated as a unit. According to various embodiments, a page of NVM as used herein refers to one or more of: a single page of NVM; a multi-block page of NVM; a multi-block page of NVM for writing that is optionally and/or selectively treated as one or more individual pages for reading; and any other grouping or association of pages of NVM.

In some embodiments, not all R-blocks are a same size due, e.g., to skipping of failed (e.g. bad) blocks. For example, if Block 710.0B0 is defective and unusable, then R-block 760.0 has one fewer block than R-block 760.1.

In some embodiments, each R-block contains an R-block header, such as a particular form of Header 501, and the type field specifies an R-block type (and not, e.g. a data type). In further embodiments, the R-block header is repeated in a plurality of blocks in the R-block, such as in a first page in each of the blocks in the R-block. According to various embodiments, the R-block header includes one or more of: an R-block type; an R-block band; an R-block sequence number; a previous R-block number; and other information. The R-block type indicates a type of information contained in the R-block, such as host data information, map information, or checkpoint information. The R-block band specifies which one of a plurality of bands includes the R-block. For example, the R-block band specifies one of a hot data band, a cold data band, a map band, or a checkpoint band. The R-block sequence number is incremented once for each R-block used, and provides an ordering of R-block creation. In some usage scenarios, the R-block sequence number is per-band, while in others the R-block sequence number is global. The previous R-block number enables R-blocks in a given one of the bands to be linked together in reverse (e.g. backwards in time) order.

In some embodiments, recovery includes (such as begins with) determining the R-block headers of each of the R-blocks, and using contents of the R-block headers to determine a last (most-recently written) R-block in each of the bands.

Self-Journaling and Hierarchical Consistency

An example of self-journaling is when an object includes sufficient information to recover the object solely within the object itself (e.g. storing an LBA with an LB the LBA corresponds to). An example of hierarchical consistency is determining which version of a data structure to use via examining a version of another data structured. E.g. a data version identified by a particular time marker has precedence over a map version identified by the particular time marker that in turn has precedence over a checkpoint version identified by the particular time marker. Using self-journaling techniques in conjunction with hierarchical consistency techniques enables, in some embodiments and/or usage scenarios, more efficient map rebuilding and/or lower-latency FUA handshaking than without using the techniques.

In various embodiments, a map (from LBAs to read units, such as all or any portion of Map 141 of FIG. 1A) is a one-level, two-level, or multi-level map, and is implemented as one or more of: a table, a CAM, a hash table, a search tree, any structure associating a key (such as an LBA) with a value (such as a read unit address), or any combination thereof. In some embodiments, the map includes a cache to hold frequently accessed and/or dirty entries. The map cache is implemented as one or more of a table, a CAM, a hash table, a search tree, any structure associating a key (such as an LBA) with a value (such as a read unit address), or any combination thereof.

In various embodiments, write data is stored as logical pages, pages of NVM, single read units, or as one or more of the preceding via storing a length in a map entry associated with each LBA. A host provides the write data at a finest granularity of an LB (addressed by an LBA). In various embodiments, an LB from the host is optionally and/or selectively compressed and consumes less than one read unit, one read unit, more than one read unit, a non-integral number of read units, or some other size.

In further embodiments, the host provides the write data in a granularity finer than that of an LB, such as sector granularity. For example, a sector is 512B, and each LB includes eight sequential sectors. A write operation from the host having a data size that is less than a size of an LB, or having an alignment causing only a portion of a particular LB to be written, is processed as a read-modify-write operation.

In some embodiments, using read units as an example, the map associates a particular LBA with a respective read unit address and a respective length and/or span, such as in read units (e.g. LBA 211 mapped by Map 141 to Read Unit Address 223 and Length in Read Units 225, as illustrated in FIG. 2, with Length in Read Units 225 encoding length, as a size of data of the particular LBA, and span, as a number of read units to read to obtain the data). A logical block (LB) referenced by the particular LBA is stored starting in a particular read unit in the NVM addressed by the respective read unit address and spanning a number of read units given by the respective span. For example, a span of one indicates that the LB is contained within the particular read unit. In various embodiments and/or implementations, the particular read unit stores none, a fraction of, or one or more other LBs.

The particular read unit includes a header for each of one or more LBs that start in the particular read unit (e.g. Header 1 411A through Header N 419A of FIG. 4A and Header 1 411B, Header 2 412B . . . Header N 419N of FIG. 4B). Each of the headers includes a respective LBA of the LBs that is stored in the particular read unit (e.g. LPN 517 and/or Offset 521 of Header 501 of FIG. 5). For example, a particular one of the headers associated with the particular LBA includes the particular LBA. In various embodiments, the headers include other information such as: an offset in the read unit where the LB is found, an indication of a type of compression used on the LB, a length of the LB as stored in bytes, and other information.

Various embodiments are contemplated, using one or more of various techniques for storing headers and data in a read unit, such as with respect to data organization and/or ordering, presence (or not) of a header in a read unit having no start of an LB, whether headers indicate a start or an end of a read unit, and whether headers are stored in a first or a last read unit of data that the headers respectively correspond to.

An example of a self-journaling property is the aforementioned storing of one or more respective LBAs (such as in one or more headers of a read unit) of one or more respective LBs that are stored in the read unit. The self-journaling property enables recovery of map information for the LBAs and the corresponding LB data (e.g. from the headers) subsequent to the read units being written to flash memory, as processing the read units alone enables recovery of the map information.

In various embodiments and/or usage scenarios, various techniques for recovery (e.g. in response to an unexpected power loss, a malfunction, or other event that disrupts and/or prevents storage of data to NVM) are used. For example, a checkpoint is maintained by periodically writing out information to enable, in whole or in part, recovery from a malfunction. In some embodiments, the checkpoint has a plurality of entries, each entry providing recovery information up to a certain point in a stream of activity to a non-volatile storage system (e.g. NVM of an SSD). In various embodiments, various checkpoint entries include different types of information, such as different checkpoint information being recorded at different times.

In some embodiments, rolling checkpoints are written, with multiple checkpoint entries each including at least a portion of one or more data structures (such as a portion of a first-level map and/or all of an R-block usage count table). Rolling checkpoints distribute cost (e.g. in performance, in extra writes to the NVM, and in management overhead of the NVM) of saving checkpoint information over time. In some embodiments, rolling checkpoints enable locking only a portion of a data structure that is being checkpointed during creation of the checkpoint, leaving the remainder of the data structure unlocked and thus available for non-checkpoint use.

For example, in various embodiments, at least some of the checkpoint entries (but not necessarily all), include a list of free R-blocks (stored in an order that the free R-blocks are to be used). The checkpoint is written so that on recovery, (a) the checkpoint is locatable in the NVM, (b) a latest checkpoint entry is determinable, and (c) in some embodiments, the checkpoint is replayable in forward and/or reverse time order. For example, the checkpoint is written to a particular location in the NVM, and in a FIFO order (so later entries are after earlier entries). Eventually writing to the checkpoint FIFO "wraps" and oldest entries are erased and/or are over-written by younger entries. Writing to the checkpoint FIFO optionally includes writing with a timestamp so that a respective age of checkpoint entries is determinable (e.g., to distinguish a youngest and an oldest entry in the FIFO). In various other embodiments, data structures other than a FIFO (e.g. a ping-pong structure, a table, and other data structures enabled to store checkpoint entries) are used to store checkpoints. While in some embodiments the checkpoint FIFO is a first-in, first-out data structure, in other embodiments the checkpoint FIFO is implemented with other structures, such as a queue, a stream, or a randomly accessible structure written in a predetermined order.

In some embodiments, data is written in one or more data streams. As the host provides write data, even though the data is for non-contiguous regions (e.g. unrelated groups of LBAs), the write data is aggregated into R-blocks. The data stream of write data is similar to a log of host write activity, as the data stream records the data of the host writes (although not necessarily, in all embodiments, in the identical order the data arrives from the host). In various embodiments, there are one or more data streams. For example, in some embodiments, recycle activity (reclaiming free space from R-blocks that have been wholly and/or partially over-written) is directed to a recycling data stream, while host write activity is directed to a host data stream that is separate from the recycling data stream. In further embodiments, host data is written to a first R-block, and contemporaneous recycled data is written to a second, different R-block. Separating recycled (cold) data from newly-written (hot) data is advantageous, in some usage scenarios. In still further embodiments, some of the host data, such as a portion of the host data that is determined to be cold, is selectively written to the second R-block.

According to various embodiments, checkpoint entries are created periodically in time, such as in response to host commands and/or in response to specified amounts of activity (e.g. a specified amount of host write data, a specified number of map references, and/or a specified amount of dirty map information). In further embodiments, different structures are checkpointed at different times and/or according to different rules.

In various embodiments, checkpoints include some or all of one or more data structures such as: a first-level map, a map cache, an R-block usage table, R-block statistics such as erase counts, other statistics such as error counts or read disturb information accumulated on an R-block or other basis, a free list, and other state information and/or tables of use in a non-volatile storage system.

In some embodiments, data structures included in whole or in part in one or more of the checkpoint entries are used in a recovery process. In further embodiments, such as with rolling checkpoints, multiple checkpoint entries are used to recover a data structure, such as a first-level map.

In one example, on recovery, a checkpoint FIFO is used to find a latest one of one or more lists of free R-blocks saved in entries of a checkpoint of the checkpoint FIFO. The R-blocks in the latest list of free R-blocks are then read to find which of the R-blocks have already been used (determinable because the R-blocks that are used are not in an erased state). In some usage scenarios, a fraction of an R-block was written prior to a malfunction, and the fraction of the R-block that was written is recoverable. Read units in the R-blocks in the latest list of free R-blocks are scanned to find any headers in the read units. The headers include LBAs indicating LBs stored in the read units. A map (that enables determining where in NVM data for LBAs is stored) is checked to determine if any of the LBAs are missing from the map. E.g., if an entry of the map for one of the LBAs refers to an older read unit than the read unit that the LBA was found in. If the map is out-of-date, the map is updated. In some usage scenarios, a same LBA is found in a first read unit and then subsequently in a second read unit, e.g., when the LBA has been written to more than once during a checkpoint period. Thus, in this example, data read units are conceptually processed in-order during recovery, and in some instances a same entry in the map is updated more than once during recovery if the same LBA is found more than once in the headers in the read units. In another example, data read units are conceptually processed backward (rather than in-order, e.g., forward) and repeated writes to a same LBA are discarded.

Various techniques are used to synchronize the map and write data written to the NVM. Some of the techniques are applicable to embodiments with a one-level map, while others of the techniques are applicable to embodiments with a two-level or a multi-level map.

In some embodiments, the map is periodically checkpointed by writing some or all of the map to a checkpoint entry. In some embodiments, the entire map is written to the checkpoint FIFO. In other embodiments, the map is written to a particular ping-ponging location in the NVM (and optionally with a timestamp). In still other embodiments, an address in the NVM indicating where the map is written in the NVM is written to the checkpoint FIFO. In yet other embodiments, the map is checkpointed a portion at a time so that the entire map is checkpointed across multiple checkpoint entries (e.g. a rolling checkpoint). In some usage scenarios, checkpointing the map a portion at a time enables a decreased upper-bound on latency of some commands, such as host write commands.

In some embodiments, to resolve any consistency issues, a hierarchical consistency write ordering is imposed to ensure consistency, e.g. write data is always written to NVM prior to a corresponding updated map entry being written to the NVM. For example, in some embodiments, a map entry is only updated after the write data is committed to the NVM, and the write data includes headers recording the LBA the write data is associated with. In the interim, a pending update to the map is held in another structure, such as a map cache. In some embodiments, the map cache includes information for each entry in the map cache indicating whether the entry is "pending" (e.g. awaiting a write of write data to the NVM to complete). By delaying updating the version of the map that is checkpointed until the write data has been written to the NVM, checkpoints of the map are always older than the write data, and consistency between the map and the write data is well-defined, as LBA mapping information from the write data headers is prioritized over any conflicting (older) information from the map.

By using the hierarchical consistency write ordering, the map (as stored in the NVM and restored on recovery) always includes only earlier information than from the data read units. The recovered map is always older than any data from recovered data read units, and the headers in the recovered data read units (as determined, for example, from the list of free R-blocks in the checkpoint FIFO) are used to update the map.

In some two-level map embodiments, second-level map entries are periodically stored in NVM. A second-level map page (that includes multiple second-level map entries) includes a map header that includes a first-level map index, and an entry of the FLM associated with the first-level map index points to the second-level map page. The first-level map index provides the self-journaling property for the second-level map page. The hierarchical consistency write ordering is extended so that write data is written to the NVM first, a second-level map page that contains a particular one of the second-level map entries associated with the write data is only written to the NVM after the write of the write data is complete, and a first-level map entry pointing to the second-level map page is only updated (to refer to the updated location of the second-level map page) after the second-level map page write is complete. A list of free R-blocks optionally and/or selectively includes the R-blocks used to store the second-level map entries as well as the write data. In some embodiments, one list of free R-blocks is used for second-level map entries and another list of free R-blocks is used for the data, and R-blocks are segregated between the two lists. The two lists enable recovering the first-level map from the headers in the second-level map pages, similar to recovering a one-level map from data read units. Thus, checkpoints of the first-level map are always older than restored second-level map pages (and the first-level map is updated using the headers in the restored second-level map pages). Similarly, second-level map pages are older than write data, and second-level map pages are updated using the headers in the restored data read units.

In some embodiments, such as some embodiments with rolling checkpoints, extra journal headers are added to the data read units and/or to the map read units to record checkpoint events. The journal headers include information recording events, and the information is used to aid recovery. For example, a journal header is written to a data read unit to indicate that a portion of a map is consistent (e.g. has been checkpointed) up to that point in a data stream.

Journal headers, in some embodiments, indicate how far back in a data stream a recovery process is to start. For example, with rolling checkpoints, and in further embodiments with some checkpoint entries that omit checkpoint information of one or more data structures, recovery starts processing using information corresponding to the latest point in time that all of the data structures are fully checkpointed. For example, if the map is checkpointed in N pieces across N checkpoint entries, then recovery starts at a location (referred to as 'a farthest back point') in a data page that corresponds to a latest time that after which all N pieces of the map were checkpointed.

In some embodiments, journal headers indicate a portion of a data structure that is consistent at a certain point. Continuing the map recovery example above, at the furthest back point a first one of the N pieces of the map has been checkpointed (and is not, by definition of the farthest back point, checkpointed at a later time in the data stream). All updates subsequent to and affecting the first piece of the map are applied to the map. However, other pieces of the map are updated only after encountering a corresponding journal header indicating that subsequent data in the data stream has not been recorded in the checkpoint.

In some embodiments, a time-ordering of hierarchically consistent data and/or data structures is determined by timestamps and/or sequence numbers. That is, determining whether write data was written to NVM subsequent to or prior to a corresponding updated map entry is by a comparison of timestamps and/or sequence numbers. The timestamps and/or the sequence numbers are optionally and/or selectively output in, e.g., respective streams holding write/recycle data, map information, and/or checkpoint entries to provide a specification of an order of updates among the streams that is invariant with respect to an order that physical writes to the NVM are performed. In further embodiments, the timestamps and/or the sequence numbers are output in the streams as a special type of header termed an epoch header. Each epoch header includes a current timestamp and/or sequence number termed the epoch (e.g. Epoch 523 of FIG. 5).

In various embodiments, the epoch is advanced and/or incremented with each data write, and uniquely determines an order that data writes have been made. In further embodiments, a data structure update resulting from a particular one of the data writes is assigned the epoch of the particular data write. When the data structure update is written to a stream along with the epoch of the particular data write, an ordering of the particular data write and the data structure update is determined from respective epoch headers specifying the epoch of the particular data write and the epoch of the data structure update, independent of an order that the particular data write and the data structure update are written to NVM.

According to various embodiments, epoch headers are output one or more of: once per data write; only with some data writes; periodically in a data stream; at least once per page of NVM; and at least once per band switch. In a first example with a single data band, an epoch header is output at least once per page of the NVM that is written with data of the data stream. Providing an epoch header in each page of the data stream enables determining an epoch of data in the page without having to read multiple pages. In a second example with a plurality of data bands, such as a hot band and a cold band, an epoch header is output at least once per page of the NVM that is written irrespective of the band, and additionally whenever an immediately previous data write was to a different one of the bands than a current data write (termed a band switch). Providing an epoch header at least once per band switch enables determining an epoch of each data write even if not all data writes have a respective epoch header. Further, providing an epoch header at least once per band switch enables treating two or more bands, such as a hot band and a cold band, as a single stream by providing a consistent ordering of writes among the bands.

In some embodiments, there is a plurality of epoch sequences. In a first example, separate epoch sequences are used for newly-written vs. recycled data. Data structure updates are assigned epochs from one or more of the epoch sequences, depending on associated data writes. In a second example, data writes to the NVM are timestamped with a first epoch (e.g. from a first epoch sequence), and second-level map writes to the NVM are timestamped with a second epoch (e.g. from a second epoch sequence). Updates to the second-level map are assigned the first epoch value corresponding to an associated data write, and updates to a first-level map are assigned the second epoch value corresponding to an associated second-level map write. A map stream optionally and/or selectively has two types of epoch headers, one for the first epoch value and one for the second epoch value.

While the foregoing describes recovery of the map, other data structures are similarly recoverable using self-journaling and hierarchical consistency. For example, an R-block usage count table is similarly checkpointable and recoverable. In some embodiments, an R-block usage count includes a count of the number of active (not over-written) LBs in each R-block.

The self-journaling and hierarchical consistency properties are applicable to cached (partial) data structures as well. For example, a map cache includes dirty entries of the map. In some embodiments, each of the map cache entries corresponds to one of a plurality of second-level map pages, each of the second-level map pages including a plurality of second-level map entries, and a particular one of the map cache entries is dirty if any of the second-level map entries in the particular map cache entry are dirty. The map cache is periodically recorded, in accordance with hierarchical consistency, in a checkpoint entry (in total, in a rolling checkpoint fashion, or by periodically flushing the dirty entries of the map cache). In some embodiments, hierarchical consistency is followed on a per-map-entry basis. Continuing the example, when a portion of the map cache is saved in a checkpoint entry, only map entries corresponding to completed write data (e.g. write data that has been stored non-volatilely, such as by being committed to the NVM) are checkpointed. E.g., if an entry in the map cache has been updated and the corresponding data is not yet stored non-volatilely, then checkpointing of the updated map entry is postponed until the corresponding data is stored non-volatilely.

In some embodiments, a map cache includes two read unit addresses per entry, e.g. a hierarchically consistent read unit address, and a pending read unit address. A read access to the non-volatile storage system is enabled to use the pending read unit address to locate the latest data (that is stored, for example, in a data cache accessed by read unit addressing pending a write to the NVM). A checkpoint operation, however, is enabled to use the hierarchically consistent read unit address. When write data is written to the NVM, the corresponding pending addresses in affected map cache entries are copied to the hierarchical consistent addresses (and are then available for checkpointing).

In various embodiments, each of a plurality of entries of a map cache corresponds to one of a plurality of second-level map pages, each of the second-level map pages including a plurality of second-level map entries, and a particular one of the map cache entries is dirty if any of the second-level map entries in the particular map cache entry are dirty. According to various embodiments, each of the dirty entries of the map cache is one or more of: associated with a timestamp specifying an epoch of an oldest update of the dirty entry; associated with a timestamp specifying an epoch of a newest update of the dirty entry; and associated with an epoch of a current data write. In some embodiments, each of the dirty entries is flushed prior to when the associated timestamp specifying the epoch of the oldest update of the dirty entry is more than a determined amount behind the epoch of the current data write. In some embodiments, a timestamp stored in the NVM with a flushed one of the dirty entries is any one or more of the timestamps associated with the flushed dirty entry.

Other schemes are possible, such as using separate hierarchically consistent and pending map caches, such as with entries in the pending map cache being copied to the hierarchically consistent map cache as the entries are written to the NVM.

In some embodiments, dynamic structures such as map caches that are used to dynamically map LBAs (that is, when the LBAs are being written) only exist in the NVM in a checkpointed form. E.g., the structures, unlike the map itself, have no permanent storage. For example, in some embodiments, only dirty entries in a map cache are checkpointed, and if the map cache has no dirty entries for an extended period (and the checkpoint FIFO has wrapped), then no checkpoint for the map cache exists. Because the dynamic structures exist in the checkpoints (when necessary), the dynamic structures are also reconstructable during recovery after a malfunction.

Particular Embodiments

Various particular embodiments implement one or more techniques applicable to and/or related to self-journaling and hierarchical consistency in non-volatile storage systems. A two-level mapping scheme is managed via writes to a map stream and a checkpoint stream, with host and recycle data writes to one or more data streams. Restoration of FLM and SLM elements of the two-level mapping scheme uses information from the checkpoint stream, followed by information from the map stream, and then by information from the data streams. During the restoration, the data streams take precedence over the map stream, and the map stream takes precedence over the checkpoint stream.

Figure 8:
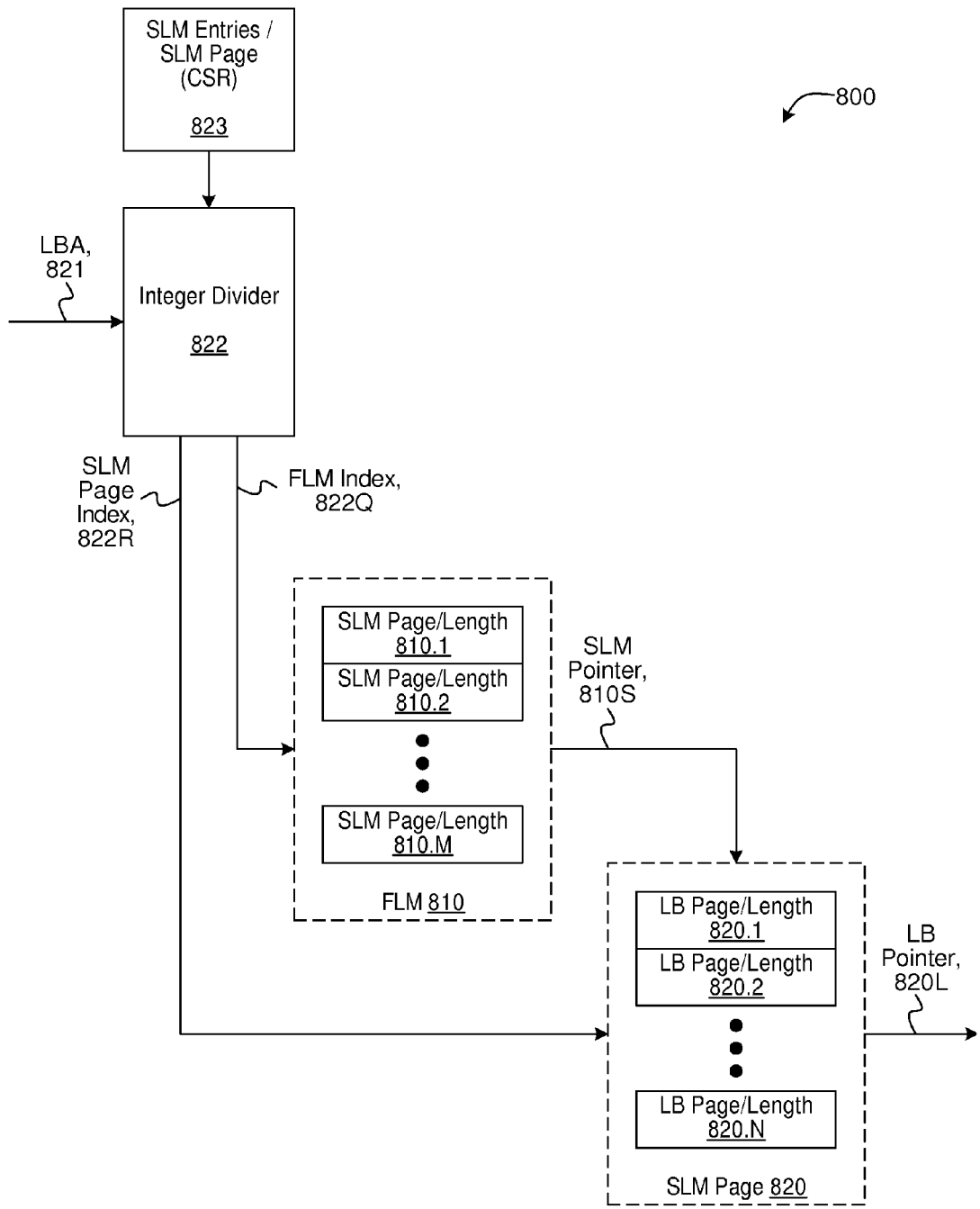
FIG. 8 illustrates selected details of an embodiment of mapping LBAs to Logical Blocks (LBs) stored in an NVM via a two-level map having a First-Level Map (FLM) and one or more Second-Level Map (SLM) pages.

FIG. 8 illustrates, as LBA to NVM Location Mapping 800, selected details of an embodiment of mapping LBAs to LBs stored in an NVM via a two-level map having an FLM and one or more SLM pages. The two-level map is implemented via a first-level element (FLM 810) coupled to one or more second-level elements (illustrated conceptually as a single element SLM Page 820). The FLM includes a plurality of entries (SLM Page/Length 810.1 . . . SLM Page/Length 810.M). Each of the entries of the FLM points to one of the SLM pages (such as SLM Page 820). The SLM page includes a plurality of entries (LB Page/Length 820.1 . . . LB Page/Length 820.N). Each of the entries of the SLM pages points to a location in the NVM where data begins (e.g. a read unit storing at least the beginning of host write data for an LBA). A divider (Integer Divider 822) receives a parameter from, e.g., a programmable hardware register (SLM Entries/SLM Page (CSR) 823), to divide an incoming LBA by to determine which FLM entry to select and which SLM entry (within the SLM page pointed to by the selected FLM entry) to select. The divider is coupled to the FLM and the SLM pages.

In various embodiments, the figure is illustrative of selected details of or related to Map 141 and/or Table 143 of FIG. 1A. For example, in some embodiments, Map 141 and/or Table 143 implement one or more caches of mapping information, such as one or more entries of an FLM and/or one or more entries of an SLM. An entire image of the FLM and/or the SLM is maintained in a portion of NVM (e.g. NVM 199 of FIG. 1A), updated, e.g., when the caches replace a previously cached FLM and/or SLM entry. In some embodiments, the FLM and/or the SLM entire images are implemented via rolling or ping-pong checkpoints, each of the checkpoints being a portion of the respective entire map image.

In operation, LBA 821 is presented to Integer Divider 822. The divider divides the LBA by a number of SLM entries per SLM page, as provided by SLM Entries/SLM Page (CSR) 823, resulting in a quotient (FLM Index 822Q) and a remainder (SLM Page Index 822R). The quotient is used to select one of the FLM entries, and a page field of the selected FLM entry is read (SLM Pointer 810S). The page field is used to select one of the SLM pages (e.g. SLM Page 820), and the remainder is used (e.g. as an offset) to select an entry of the selected SLM page. A page field of the selected SLM page entry is used to select a particular location in the NVM, such as a particular read unit, where at least the beginning of the LB corresponding to the presented LBA is stored (LB Pointer 820L). In various embodiments, the LB pointer includes an address of a read unit of the NVM (e.g. Read Unit Address

223 of FIG. 2). In some embodiments, each of the SLM entries includes a length field (e.g. encoding size and/or span) indicating how many read units to read to obtain all of the data for an LB and/or where within a read unit data for an LB begins (e.g. Length in Read Units 225 of FIG. 2). In some embodiments, each of the FLM entries includes a length field (e.g. encoding size and/or span) indicating how many read units to read to obtain all of the respective SLM page specified by the page field of the FLM entry (e.g. Length in Read Units 225 of FIG. 2).

In various embodiments, the quotient is used as a key to access a cache, such as a fully associative cache of SLM pages. If there is a hit in the cache for a particular SLM page, then a latest copy of the particular SLM page is found in the cache without accessing the NVM. Providing fast access to a plurality of SLM pages enables, in some embodiments and/or usage scenarios, more efficient processing of a plurality of independent streams of sequential data accesses to NVM (e.g. a first stream of sequential data accesses to a first region of LBAs interspersed with a second stream of sequential data accesses to a second region of LBAs).

Figure 9:
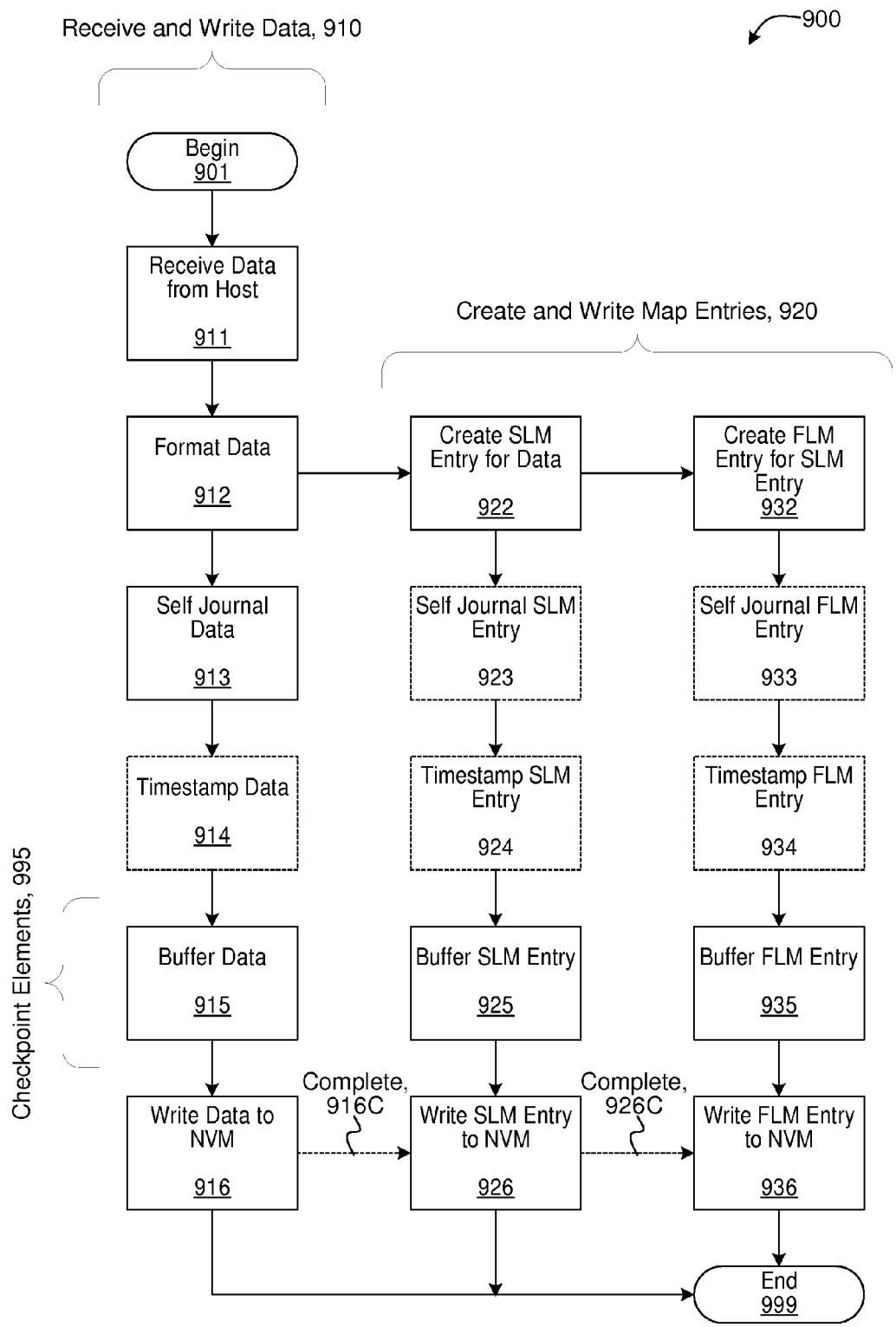
FIG. 9 illustrates selected details of various embodiments of receiving and writing data from a host to NVM, including writing of SLM and FLM information, and various forms of self-journaling and timestamp recording.

FIG. 9 illustrates, as Data, Map, and Checkpoint Write Processing 900, selected details of various embodiments of receiving and writing data from a host to NVM, including writing of SLM and FLM information, and various forms of self-journaling and timestamp recording. The processing is also applicable to data sourced from recycling operations. The processing conceptually has two portions, a first relating to host (or recycling) data proper (Receive and Write Data 910), and a second relating to mapping the data (Create and Write Map Entries 920). Further, selected ones of the operations illustrated are subject to checkpointing (Checkpoint Elements 995).

Processing starts (Begin 901) upon receipt of a host write command (or a recycling operation data production). Then the host (or recycling) data is obtained (Receive Data from Host 911). The data is then transformed for writing to the NVM, such as via compression, encryption, padding, and/or various formatting operations (Format Data 912). Subsequently self-journal information is inserted in the data, such as via a header indicating which LBA the data corresponds to (Self Journal Data 913). In some embodiments, the header includes length and/or offset and/or other information, such as illustrated in FIG. 5. Then a time marker is inserted in the data, such as via an epoch field in the header (Timestamp Data 914). In various embodiments, the time marker is inserted as a particular type of header. Subsequently the data, the header, and the time marker are aggregated with other host (or recycling) data and header information (Buffer Data 915). When sufficient information has been aggregated, the aggregated information is written to the NVM (Write Data to NVM 916).

The formatting of the data (Format Data 912) provides information used, in part, to create a map entry, starting with information for a second-level of a two-level map (Create SLM Entry for Data 922) that points to the location in the NVM the data is written, such as a read unit address and a length in read units. In some embodiments, further information to create the map entry is provided, in part, by determining where in the NVM the data is written, as determined by Buffer Data 915. Then self-journaling information is inserted in the entry, such as via a header providing an FLM index corresponding to the SLM entry (Self Journal SLM Entry 923). In some embodiments, the header includes length, offset, and/or other information, such as illustrated in FIG. 5. Subsequently a time marker is inserted in the entry, such as via an epoch field in the header (Timestamp SLM Entry 924). In various embodiments, the time marker is inserted as a particular type of header. Then the entry, the header, and the time marker are aggregated with other SLM entries and headers (Buffer SLM Entry 925). When sufficient information has been aggregated, the aggregated information is written to the NVM (Write SLM Entry to NVM 926). In some embodiments, the aggregating of SLM information is at least in part via one or more caches.

The creating of the SLM entry (Create SLM Entry for Data 922) provides information that is used, in part, to complete the creation of a map entry, by creating an FLM entry (Create FLM Entry for SLM Entry 932) that points to the SLM entry. Similar to the SLM entry, there are self-journaling and time marker inserting (Self Journal FLM Entry 933 and Timestamp FLM Entry 934), followed by buffering and writing to the NVM (Buffer FLM Entry 935 and Write FLM Entry to NVM 936). After writing the data, the SLM entry, and the FLM entry to the NVM (Write Data to NVM 916, Write SLM Entry to NVM 926, and Write FLM Entry to NVM 936), processing is finished (End 999).

In some embodiments, SLM entries are organized as SLM pages and SLM pages are cached (e.g. in a cache), enabling multiple updates (Create SLM Entry for Data 922) of entries of the SLM page prior to writing the SLM page to the NVM (Self Journal SLM Entry 923 to Write SLM Entry to NVM 926). Each of the cached ones of the SLM pages is enabled to accumulate updates from one or more data writes, and optionally and/or selectively is not written to the NVM until the respective cached SLM page is flushed from the cache. According to various embodiments, a time marker written to the NVM with a flushed one of the cached SLM pages is one or more of: a time marker corresponding to a latest data write that affected an entry in the flushed SLM page; a time marker corresponding to an earliest data write that affected an entry in the flushed SLM page since it was cached; a time marker corresponding to a current data write; and a time marker corresponding to a map stream.

In some embodiments, FLM entries are written to the NVM in portions as part of a rolling checkpoint, enabling multiple updates (Create FLM Entry for SLM Entry 932) of entries of the portion of the FLM prior to the writing of the portion of the FLM to the NVM (Self Journal FLM Entry 933 to Write FLM Entry to NVM 936). Each of the portions of the FLM is enabled to accumulate updates from one or more SLM entries, and optionally and/or selectively is not written to the NVM until a checkpoint of the portion of the FLM is made (e.g. as part of a rolling checkpoint). According to various embodiments, a time marker written to the NVM with one of the portions of the FLM is one or more of: a time marker corresponding to a latest data write that affected an entry in the portion of the FLM; a time marker corresponding to an earliest data write that affected an entry in the portion of the FLM since the portion of the FLM was last checkpointed; a time marker corresponding to a current data write; and a time marker corresponding to a map stream, such as a time marker in a map stream of an SLM entry with a corresponding update in the portion of the FLM.

In various embodiments, the self-journaling information that is inserted, e.g. via headers, is included in headers as illustrated in FIGS. 4A, 4B, and 5. In some embodiments, the aggregating of FLM information is at least in part via one or more caches, independently of caching, if any, of SLM information, or alternatively in cooperation with caching of SLM information.

The Data processing from receipt to writing to the NVM (Format Data 912 to Write Data to NVM 916) proceeds independently of map processing, from creation to writing to the NVM (Create SLM Entry for Data 922 to Write SLM Entry to NVM 926 and/or Create FLM Entry for SLM Entry 932 to Write FLM Entry to NVM 936), in various embodiments and usage scenarios. Further, SLM and FLM processing, from creation to writing to the NVM (Create SLM Entry for Data 922 to Write SLM Entry to NVM 926 and Create FLM Entry for SLM Entry 932 to Write FLM Entry to NVM 936, respectively) proceed independently of each other, in various embodiments and usage scenarios. The data, SLM, and FLM processing occurs wholly or partially in parallel with each other, limited solely by dependencies relating to creation of an SLM entry (Format Data 912 to Create SLM Entry for Data 922) and creation of an FLM entry (Create SLM Entry for Data 922 to Create FLM Entry for SLM Entry 932).

In various embodiments, in addition to processing between write data (Receive and Write Data 910) and processing of map entries (SLM- and FLM-related portions of Create and Write Map Entries 920) being independent (and thus wholly or partially in parallel or overlapping), processing within each of 910 and the SLM- and FLM-related portions of 920 are wholly or partially in parallel, overlapping, and/or pipelined. For example, first host data are received (Receive Data from Host 911) and while the first host data is being formatted (Format Data 912), second host data is received in parallel (Receive Data from Host 911). For another example, a first SLM entry is created (Create SLM Entry for Data 922), and then while the first SLM entry is being self-journaled (Self Journal SLM Entry 923), a second SLM entry is created in parallel (Create SLM Entry for Data 922). Further, an FLM entry for the first SLM entry is created (Create FLM Entry for SLM Entry 932) in parallel with the creating of the second SLM entry (and the self-journaling of the first SLM entry).

In some embodiments, later operations are enabled to complete sooner than operations that began prior to the later operations. In a first example, an order that data writes to two different bands are written to the NVM is not specified. In a second example, caching of SLM pages enables updates to SLM entries from later data writes to be written to the NVM prior to updates to SLM entries from data writes that are earlier than the later data writes.

In various embodiments, inserting of time markers is selective, optional, and/or omitted (e.g., one or more of Timestamp Data 914, Timestamp SLM Entry 924, and Timestamp FLM Entry 934 are omitted, or are only selectively inserted). Further, writing of map information is delayed until (or is performed in response to) completing writing of data information. For example, recording SLM entry information to the NVM awaits completion of writing of data to the NVM (e.g. Write SLM Entry to NVM 926 is dependent upon Write Data to NVM 916, as indicated by Complete 916C). Continuing with the example, recording FLM entry information in the NVM awaits completion of writing of the SLM information to the NVM (e.g. Write FLM Entry to NVM 936 is dependent upon Write SLM Entry to NVM 926, as indicated by Complete 926C). Recovery processing uses all FLM information written to the NVM, as well as all SLM information written to the NVM, as the FLM and SLM information is not written until data information pointed to by the FLM and SLM information has been previously written. Thus the data and map information on the NVM are consistent with each other.

In some embodiments, time markers are selectively inserted. For example, instead of inserting consecutive time markers in a same page of the NVM for consecutive data writes stored in the same page, only a first one of the time markers is inserted. A value of a subsequent one of the time markers is inferred from a value of the first time marker and a number of intervening consecutive data writes.

In various embodiments, time markers are inserted, enabling writing of data, SLM, and FLM information independently of each other, such as wholly or partially in parallel or out-of-order with respect to each other. The independent writing enables, in some embodiments and/or usage scenarios, more efficient processing (e.g. lower latency and/or higher bandwidth) than dependent writing (e.g. as illustrated conceptually by Complete 916C and Complete 926C).

In a specific operating scenario, data writes are to a data stream of an NVM (e.g. Write Data to NVM 916 is to the data stream), and map writes are to a map stream and/or a checkpoint stream of the NVM (e.g. Write SLM Entry to NVM 926 and Write FLM Entry to NVM 936 are to the map stream and the checkpoint stream, respectively). One or more of the data writes are delayed (such as due to awaiting completion of an erasing operation that conflicts with writing the data stream). Meanwhile, at least one of the map stream writes occur, wholly or partially in parallel with the erasing operation, such that a write of at least one map entry corresponding to at least some of the delayed write data is completed before the delayed write data is written. Subsequently the erasing operation is completed and then the delayed data writes are completed. If there were a malfunction before completing the delayed data writes, then a subsequent recovery would determine that any of the map stream writes corresponding to the delayed data writes were to be ignored, based on examination of the time markers in the data and map streams. Specifically the time markers of the map stream writes corresponding to the delayed writes would be ahead (e.g. more recent or younger) than the latest (e.g. most recent or youngest) of the data stream writes.

In various embodiments, inserting of self-journaling of map information is optional and/or omitted (e.g. one or more of Self Journal SLM Entry 923 and Self Journal FLM Entry 933 are omitted).

In some embodiments and/or usage scenarios, one or more of the elements of the figure are subject to checkpointing (Checkpoint Elements 995). Checkpoints are written to an NVM at various points in time to enable, in some scenarios, more efficient and/or robust recovery processing. For example, one or more of aggregated data, SLM information, and FLM information (Buffer Data 915, Buffer SLM Entry 925, and Buffer FLM Entry 935) are included in checkpoints. In various embodiments, recovery processing uses time markers included in checkpoints to determine whether or not to ignore certain portions of a checkpoint. For example, if a latest portion of a data stream (corresponding to Buffer Data 915) has no time markers later than a latest SLM portion of the checkpoint (corresponding to Write SLM Entry to NVM 926), then the latest SLM portion of the checkpoint is discarded during recovery processing.

Figure 10:
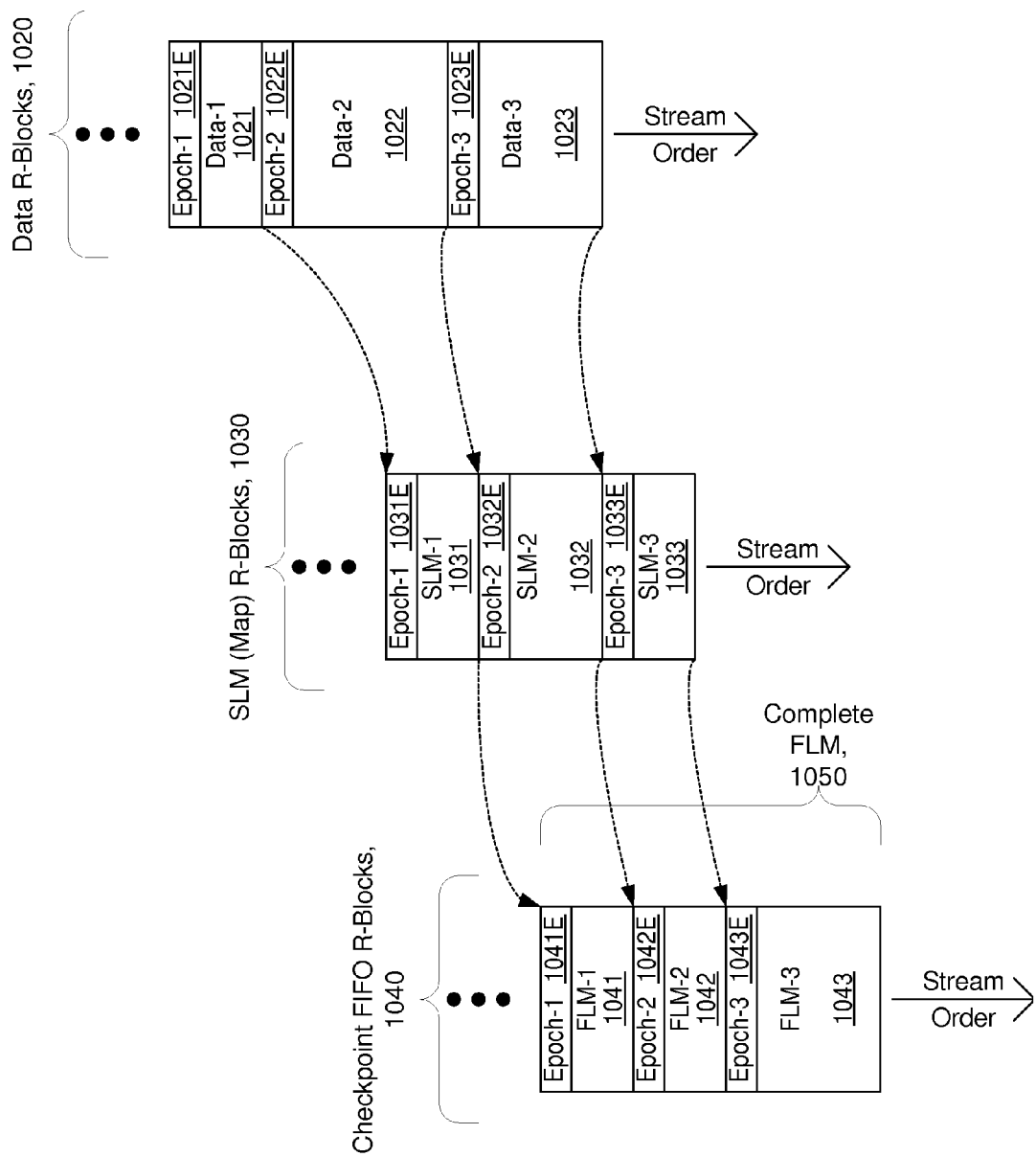
FIG. 10 illustrates selected details of various embodiments of streaming host and/or recycled data, map information, and checkpoint First-In First-Out (FIFO) portions to NVM.

FIG. 10 illustrates selected details of various embodiments of streaming host and/or recycled data, map information, and checkpoint FIFO portions to NVM. Three streams of R-blocks are illustrated, one for data writes (Data R-Blocks 1020), one for updated SLM writes (SLM (Map) R-Blocks 1030), and one for data structure checkpoint writes, such as portions of an FLM (Checkpoint FIFO R-Blocks 1040), corresponding to respective data, map, and checkpoint bands managed as streams. The "Epoch" elements correspond to time markers, e.g. timestamps in respective headers (such as illustrated by Epoch 523 of FIG. 5). In FIG. 10, time is least recent to most recent from left to right, according to each respective stream order. Further, the figure is also representative of write order within each stream, subject to limitations of granularity of writing the NVM, such as by pages of the NVM. Elements with one of the pages of the NVM are conceptually written in the order shown, even if physically written at a same time. Thus elements of the data R-blocks are written in the following order: Epoch-1 1021E (least recent), Data-1 1021, Epoch-2 1022E, Data-2 1022, Epoch-3 1023E, and Data-3 1023 (most recent). Elements of the map R-blocks are written in the following order: Epoch-1 1031E (least recent), SLM-1 1031, Epoch-2 1032E, SLM-2 1032, Epoch-3 1033E, and SLM-3 1033 (most recent). Elements of the checkpoint map R-blocks are written in the following order: Epoch-1 1041E (least recent), FLM-1 1041, Epoch-2 1042E, FLM-2 1042, Epoch-3 1043E, and FLM-3 1043 (most recent).

Information in the data R-blocks has precise coherency, since the information in the data R-blocks determines what has been validly stored in the NVM. Precise coherency refers to a property of a data structure (including data written to the NVM) that enables complete recovery of a valid state of the data structure from a latest portion of the data structure written to the NVM. Precise coherency is distinguished from consistency among multiple data structures. For example, two data structures each have precise coherency, but are inconsistent with respect to each other because one of the data structures reflects state changes that are not present in the other data structure. In some embodiments and/or usage scenarios, a goal of recovery is to determine precisely coherent versions of data structures that are also consistent with each other as of a latest possible time.

Information in the map R-blocks is a FIFO-like stream of updated SLM pages, and is used to maintain precise coherence of the SLM as stored, at least in part, in the map R-blocks. In some situations, information in the map R-blocks is inconsistent with data written to the NVM, such as due to SLM pages that are inconsistent with information in the data R-blocks, due, e.g., to SLM pages that are more recent than corresponding information in the data R-blocks.

Information in the checkpoint R-blocks is a FIFO (or a stream) of portions or all of the FLM and other data structures, and is used to maintain precise coherence of the FLM and precise or approximate coherence of the other data structures. Similar to the map R-blocks, however, in some situations information in the checkpoint R-blocks is inconsistent with information in other R-blocks, such as FLM entries that are more recent than corresponding information in the map or the data R-blocks.

In some embodiments and/or usage scenarios, some data structures stored in the checkpoint FIFO are only approximately coherent or are inconsistent with other data structures. In a first example, read disturb counts are maintained for each block in the NVM, and the read disturb counts are checkpointed in the checkpoint FIFO in a plurality of portions, for example one fourth of the read disturb counts at a time, spread evenly over time. When the read disturb counts are recovered, the recovered read disturb counts are not coherent with any version of the read disturb counts that were in use, since each of the four portions is from a different point in time. In a second example, R-block usage information is checkpointed in the checkpoint FIFO, but without a corresponding timestamp. A latest version of the R-block usage information restored on recovery is coherent, but in some circumstances is inconsistent with other data structures.

Conceptually the figure is representative of stream priority during recovery operations. Information in the data stream of R-blocks takes precedence over information in the map stream of R-blocks that in turn takes precedence over information in the checkpoint stream of R-blocks. Because writes among the streams are not well ordered (while, in some embodiments and/or usage scenarios, writes within each of the streams are well ordered), there is a need for additional information to determine a consistent ordering of the writes among the streams. In various embodiments and/or usage scenarios, timestamps and/or time markers, such as epoch values, enable a relative order of writes to a plurality of bands and/or streams to be determined.

As illustrated, the writes to the data, map, and checkpoint streams of R-blocks are consistent with respect to each other, as follows. Each of the data writes precedes the respective SLM update corresponding to the respective data write, and in turn, each of the SLM updates precedes any respective checkpoint writes that include (e.g. as FLM entries) pointers to the respective SLM update. Specifically, SLM-1 1031 maps to Data-1 1021, and writing of Data-1 1021 completes before writing of Epoch-1 1031E and SLM-1 1031 begins. Further, FLM-1 1041 includes a pointer to SLM-1 1031, and writing of SLM-1 1031 completes before writing of Epoch-1 1041E and FLM-1 1041 begins. Similar dependences and write orderings apply to Data-2 1022, Epoch-2 1032E and SLM-2 1032, and Epoch-2 1042E and FLM-2 1042, as well as Data-3 1023, Epoch-3 1033E and SLM-3 1033, and Epoch-3 1043E and FLM-3 1043.

In some embodiments, consistency between the streams of R-blocks is indicated by epoch values as follows. Epoch-1 1031E is identical to Epoch-1 1021E, or alternatively indicates Epoch-1 1031E was written after Epoch-1 1021E. Epoch-1 1041E is identical to Epoch-1 1031E or alternatively indicates Epoch-1 1041E was written after Epoch-1 1031E. Similarly Epoch-2 1032E is identical to (or indicates writing after) Epoch-2 1022E, and Epoch-2 1042E is identical to (or indicates writing after) Epoch-2 1032E. Similarly Epoch-3 1033E is identical to (or indicates writing after) Epoch-3 1023E, and Epoch-3 1043E is identical to (or indicates writing after) Epoch-3 1033E.

In various embodiments and/or usage scenarios, write ordering within each stream remains as illustrated. However, relative timing of writes between the streams of R-blocks is different than illustrated. For example, writing of Epoch-2 1032E and SLM-2 1032 complete before writing of Data-2 1022 begins (but after writing of Data-1 1021 completes). Thus SLM-2 1032 is temporarily inconsistent with respect to Data-2 1022, as indicated by the most recently written time marker of the data stream of R-blocks (Epoch-1 1021E) indicating an older age than indicated by Epoch-2 1032E. If a malfunction occurred before writing of Epoch-2 1022E and Data-2 1022 completed, then the temporary inconsistency of SLM-2 1032 becomes permanent. To resolve the inconsistency, subsequent recovery processing would discard SLM-2 1032 (based on Epoch-2 1032E being more recent than Epoch-1 1021E). For another example, if writing an FLM entry in the checkpoint stream of R-blocks before writing the corresponding SLM update in the map stream of R-blocks is followed by a malfunction and subsequent recovery processing (before writing the corresponding SLM update), then the recovery processing discards the FLM entry.

The figure illustrates a region of the stream of checkpoint R-blocks as corresponding to all entries of an FLM (Complete FLM 1050). The region corresponds to some embodiments where the FLM is checkpointed in portions (e.g. chunks). As illustrated, three optionally and/or selectively overlapping portions (FLM-1 1041, FLM-2 1042, and FLM-3 1043) collectively form a checkpoint of all of the entries of the FLM, though each of the portions is from a different time and hence by themselves are not a coherent image of the FLM. A recovery process is enabled to restore a coherent and consistent version of the FLM from the checkpoint of the FLM and other data structures. Similarly, the recovery process is enabled to restore a coherent and consistent version of the map from a possibly incoherent copy of the map in a map stream and other data structures.

In some embodiments, consistency of a particular data structure is maintained, in part, by ensuring that a number of related updates to the particular data structure and a subsequent timestamping of the particular data structure are performed as an atomic unit, at least with respect to checkpoints of the particular data structure. For example, consider an R-block usage count data structure that is checkpointed in the checkpoint FIFO. A particular one of the data writes in the data stream is associated with a corresponding epoch value in the data stream. The particular data write increases usage of an R-block containing the data write, and decreases usage of an R-block containing a previous data write associated with a same LBA as the particular data write. Updating the R-block usage count data structure according to the data write comprises three operations: increasing a usage count for the R-block containing the data write; decreasing a usage count for the R-block containing the previous data write; and timestamping the R-block usage count data structure with the corresponding epoch value of the particular data write. If a checkpoint of the R-block usage count data structure were enabled to occur after performing at least one of the three operations and prior to completing all of the three operations, the checkpoint would record an inconsistent version of R-block usage count data structure, and restoration of the R-block usage count data structure, such as after a power failure, would result in an inconsistent value that does not reflect the actual usage of the R-blocks after restoration. Accordingly, in various embodiments, respective updates to the R-block usage count data structure according to each data write are performed atomically with respect to checkpoints.

Figure 11:
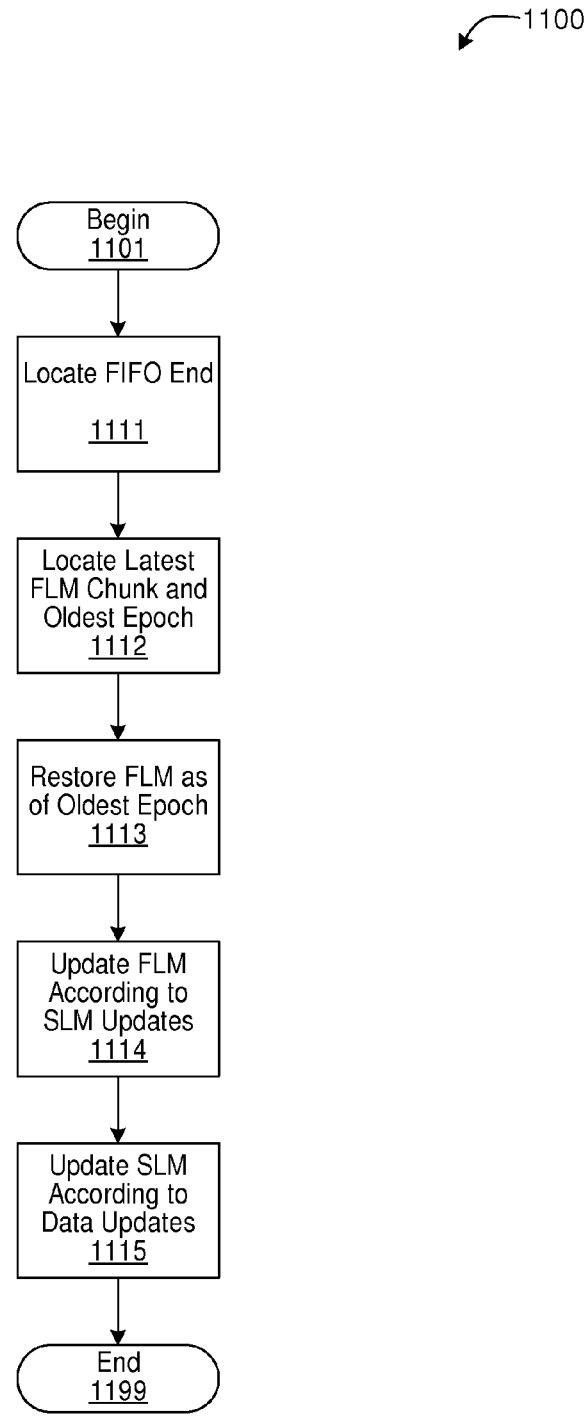
FIG. 11 illustrates selected details of restoring and/or rebuilding FLM and SLM information and other NVM management data structures, e.g. after a malfunction.

FIG. 11 illustrates, as FLM and SLM Restoration Processing 1100, selected details of restoring and/or rebuilding FLM and SLM information (such as illustrated in one or more of FIGS. 2 and 8) and other NVM management data structures, e.g. after a malfunction. The restoring and rebuilding operations are compatible with operation in conjunction with self-journaling and hierarchical consistency techniques as illustrated in one or more of FIGS. 9 and 10.

Processing as illustrated in FIG. 11 starts in response to an event after the malfunction, e.g. a recovery/rebuild request, a soft or hard reset, or a power-on (Begin 1101). The last (e.g. most recently written) R-block of checkpoint R-blocks is located, and the last (e.g. most recently written) information within the last checkpoint R-bock is located (Locate FIFO End 1111). Then portions of the checkpoint R-blocks contiguously earlier than the most recently written are processed until an entire image of the FLM is reconstructed. In some embodiments, FLM reconstruction processing includes locating an FLM portion that is the latest and locating an oldest time marker (Locate Latest FLM Chunk and Oldest Epoch 1112), and then reconstructing the FLM as of the oldest time marker (Restore FLM as of Oldest Epoch 1113). In some embodiments and/or usage scenarios, one or more later portions of the FLM are not contiguous with earlier portions due to a hole, such as due to a write that failed to complete when power failed. The portions that are non-contiguous with earlier portions are discarded during recovery.

After reconstructing the FLM based on the checkpoint R-blocks, any SLM updates that are more recent (according to time markers stored with the updates) than the reconstructed FLM are applied to the FLM (Update FLM According to SLM Updates 1114). Then the SLM is updated for any data writes that are more recent (according to time markers stored with the write data) than any corresponding SLM entries (Update SLM According to Data Updates 1115). Processing is then finished (End 1199), and the FLM, SLM, and other data structures are coherent and consistent, ready for use for operating NVM of an SSD.

In some embodiments, an amount of write data that is processed to update the SLM is bounded by ensuring that any modified SLM entries that are cached are flushed to the NVM within a determined number of epoch values, termed a map flush interval. For example, each modified SLM entry (or each modified SLM page) tracks an earliest epoch value of modification since the respective modified SLM entry (or SLM page) was last flushed, and the respective modified SLM entry (or SLM page) is flushed before the respective modified SLM entry (or SLM page) is as much as 10,000 epoch values behind the latest data write. When reconstructing the SLM from data writes that are more recent, only the most recent roughly 10,000 data writes (as measured by epoch values) are considered as SLM updates, as any older data writes have already been written to the NVM.

In some embodiments, the restoration process determines for each of a data stream, a map stream, and a checkpoint FIFO, a respective latest valid epoch and a respective earliest needed epoch. The restoration process restores the FLM from portions of the FLM found between the earliest needed epoch of the checkpoint FIFO and the latest valid epoch of the checkpoint FIFO. SLM updates found in the map stream between the earliest needed epoch in the map stream and the latest valid epoch in the map stream are applied to the FLM so that the FLM is consistent with the map stream. Updates from data writes found in the data stream between the earliest needed epoch in the data stream and the latest valid epoch in the data stream are then applied to the SLM so that the SLM is consistent with the data stream. In various embodiments and/or usages scenarios, applying updates from the data writes in the data stream to the SLM optionally and/or selectively flushes SLM entries and/or pages from a cache to the map stream, such as when the cache cannot hold all the updates necessary for recovery. SLM entry and/or page flushing during recovery updates entries of the FLM, and in turn one or more portions of the FLM are optionally and/or selectively written to the checkpoint FIFO during recovery. In various embodiments, completion of the restoration process writes a "restoration complete" marker, such as a particular type of header, to one or more of the streams.

In some embodiments, the latest valid epoch in the data stream is the last-written epoch value in the data stream (corresponding to a data write in the data stream) that is contiguous with all preceding parts of the data stream needed for recovery. The latest valid epoch in the map stream is the last-written epoch value in the map stream (corresponding to an SLM entry and/or page write in the map stream) that is contiguous with all preceding parts of the map stream needed for recovery, and is at or prior to the latest valid epoch in the data stream. The latest valid epoch in the checkpoint FIFO is the last-written epoch value in the checkpoint FIFO (corresponding to a portion of the FLM in the checkpoint FIFO) that is contiguous with all preceding parts of the checkpoint FIFO needed for recovery, and is at or prior to the latest valid epoch in the map stream. In further embodiments, the latest valid epoch in the checkpoint FIFO is also associated with contiguous checkpoints of one or more other data structures, such as with an R-block used space data structure.

In some embodiments, the earliest needed epoch in the checkpoint FIFO is an epoch value of a latest portion of the FLM such that one complete (though incoherent) version of the FLM is obtained within the earliest needed epoch in the checkpoint FIFO and the latest valid epoch in the checkpoint FIFO. The earliest needed epoch in the map stream is an epoch value of a latest SLM entry and/or page in the map stream that is at or before the earliest needed epoch in the checkpoint FIFO. The earliest needed epoch in the data stream is an epoch value of a latest data write that is at no later than the map flush interval prior to the latest valid epoch in the map stream.

In some embodiments and/or usage scenarios, such as when there has been a malfunction, a hole in a data stream is discovered during recovery. Information prior to the hole is valid, while information subsequent to the hole is not. A log record is optionally added to the data stream (e.g. during the recovery) to indicate that information between the hole and a start of recovery indication is invalid, while information after the start of recovery indication is a beginning of new valid information. In various embodiments, the start of recovery indication is a special type of header, such as a journal header, indicating a start of recovery processing.

In some circumstances, the restoration processing is relatively low-latency. For example, if the malfunction is a power loss when there have been no writes or recycling for a relatively long time, then there will be no SLM updates to apply to the FLM, and there will be no data writes that are not already reflected in the SLM. Alternatively, in other circumstances, the restoration process is relatively high-latency. For example, if the malfunction is such that the checkpoint R-blocks and/or the map R-blocks are wholly or substantially inconsistent, then up to all of the data R-blocks storing valid data information are read to rebuild the FLM, and the SLM is also entirely reconstructed. In yet other circumstances, the restoration process is medium latency. For example, if the malfunction is such that the checkpoint R-blocks are intact, and relatively few map updates are not yet reflected in the checkpoint R-blocks, as well as relatively few data writes are not yet reflected in the map R-blocks, then relatively little reconstruction of the FLM and the SLM is required.

In various embodiments, one or more elements of FIGS. 6 to 11 correspond or are related to one or more elements of FIG. 1A. For example, one or more of Devices 601 . . . 609 of FIG. 6 collectively correspond to all or portions of NVM 199. For another example, Flash Die 710.65 . . . 710.0 of FIG. 7 collectively correspond to the instances of Flash Die 194. For yet another example, the streams of R-blocks illustrated in FIG. 10 are stored in all or portions of NVM 199. In various embodiments, one or more elements of FIG. 1A manage, control, and/or implement all or any portions of techniques relating to self-journaling and/or hierarchical consistency as described elsewhere herein. For example, a portion of software execution capabilities of CPU 171 is used to manage recovery of map information (e.g. as illustrated by FIG. 11). For another example, all or portions of Buffer 131 implement all or any portions of buffering as described in FIG. 9.

Additional Implementation/Embodiment Information

In various embodiments, all or any portions of operations and/or functions such as described by FIGS. 8 through 11 are implemented, e.g., by one or more state machines. Example implementations of the state machines include hardware (e.g. logic gates and/or circuitry, dedicated state machines circuitry, or hardwired control circuitry), software (e.g. firmware or microcode), or combinations of hardware and software. In some embodiments, one or more of the state machines are implemented at least in part via one or more firmware images, one or more drivers, and/or one or more applications. As specific examples, one or more of the state machines are implemented in part via SSD Controller 100 of FIG. 1A, in part via firmware executed by CPU Core 172, in part via Firmware 106 of FIG. 1B, in part via Driver 107, and/or in part by Application 109.

In various embodiments, all or any portions of operations and/or functions described by FIGS. 8 through 11 are implemented, e.g., by, under control of, and/or in accordance with any one or more of Coherency Management 179, Translation Management 177, and or Map 141 of FIG. 1A, via any combination of hardware and/or firmware techniques.

Example Implementation Techniques

In some embodiments, various combinations of all or any portions of operations performed by a system implementing self-journaling and hierarchical consistency for managing non-volatile storage (e.g., with flash memories), a computing-host flash memory controller, and/or an SSD controller (such as SSD Controller 100 of FIG. 1A), and portions of a processor, microprocessor, system-on-a-chip, application-specific-integrated-circuit, hardware accelerator, or other circuitry providing all or portions of the aforementioned operations, are specified by a specification compatible with processing by a computer system. The specification is in accordance with various descriptions, such as hardware description languages, circuit descriptions, netlist descriptions, mask descriptions, or layout descriptions. Example descriptions include: Verilog, VHDL, SPICE, SPICE variants such as PSpice, IBIS, LEF, DEF, GDS-II, OASIS, or other descriptions. In various embodiments, the processing includes any combination of interpretation, compilation, simulation, and synthesis to produce, to verify, or to specify logic and/or circuitry suitable for inclusion on one or more integrated circuits. Each integrated circuit, according to various embodiments, is designable and/or manufacturable according to a variety of techniques. The techniques include a programmable technique (such as a field or mask programmable gate array integrated circuit), a semi-custom technique (such as a wholly or partially cell-based integrated circuit), and a full-custom technique (such as an integrated circuit that is substantially specialized), any combination thereof, or any other technique compatible with design and/or manufacturing of integrated circuits.

In some embodiments, various combinations of all or portions of operations as described by a computer readable medium having a set of instructions stored therein, are performed by execution and/or interpretation of one or more program instructions, by interpretation and/or compiling of one or more source and/or script language statements, or by execution of binary instructions produced by compiling, translating, and/or interpreting information expressed in programming and/or scripting language statements. The statements are compatible with any standard programming or scripting language (such as C, C++, Fortran, Pascal, Ada, Java, VBscript, and Shell). One or more of the program instructions, the language statements, or the binary instructions, are optionally stored on one or more computer readable storage medium elements. In various embodiments, some, all, or various portions of the program instructions are realized as one or more functions, routines, sub-routines, in-line routines, procedures, macros, or portions thereof.

CONCLUSION

Certain choices have been made in the description merely for convenience in preparing the text and drawings, and unless there is an indication to the contrary, the choices should not be construed per se as conveying additional information regarding structure or operation of the embodiments described. Examples of the choices include: the particular organization or assignment of the designations used for the figure numbering and the particular organization or assignment of the element identifiers (the callouts or numerical designators, e.g.) used to identify and reference the features and elements of the embodiments.

The words "includes" or "including" are specifically intended to be construed as abstractions describing logical sets of open-ended scope and are not meant to convey physical containment unless explicitly followed by the word "within."

Although the foregoing embodiments have been described in some detail for purposes of clarity of description and understanding, the invention is not limited to the details provided. There are many embodiments of the invention. The disclosed embodiments are exemplary and not restrictive.

It will be understood that many variations in construction, arrangement, and use are possible consistent with the description, and are within the scope of the claims of the issued patent. For example, interconnect and function-unit bit-widths, clock speeds, and the type of technology used are variable according to various embodiments in each component block. The names given to interconnect and logic are merely exemplary, and should not be construed as limiting the concepts described. The order and arrangement of flowchart and flow diagram process, action, and function elements are variable according to various embodiments. Also, unless specifically stated to the contrary, value ranges specified, maximum and minimum values used, or other particular specifications (such as flash memory technology types; and the number of entries or stages in registers and buffers), are merely those of the described embodiments, are expected to track improvements and changes in implementation technology, and should not be construed as limitations.

Functionally equivalent techniques known in the art are employable instead of those described to implement various components, sub-systems, operations, functions, routines, sub-routines, in-line routines, procedures, macros, or portions thereof. It is also understood that many functional aspects of embodiments are realizable selectively in either hardware (e.g., generally dedicated circuitry) or software (e.g., via some manner of programmed controller or processor), as a function of embodiment dependent design constraints and technology trends of faster processing (facilitating migration of functions previously in hardware into software) and higher integration density (facilitating migration of functions previously in software into hardware). Specific variations in various embodiments include, but are not limited to: differences in partitioning; different form factors and configurations; use of different operating systems and other system software; use of different interface standards, network protocols, or communication links; and other variations to be expected when implementing the concepts described herein in accordance with the unique engineering and business constraints of a particular application.

The embodiments have been described with detail and environmental context well beyond that required for a minimal implementation of many aspects of the embodiments described. Those of ordinary skill in the art will recognize that some embodiments omit disclosed components or features without altering the basic cooperation among the remaining elements. It is thus understood that much of the details disclosed are not required to implement various aspects of the embodiments described. To the extent that the remaining elements are distinguishable from the prior art, components and features that are omitted are not limiting on the concepts described herein.

All such variations in design are insubstantial changes over the teachings conveyed by the described embodiments. It is also understood that the embodiments described herein have broad applicability to other computing and networking applications, and are not limited to the particular application or industry of the described embodiments. The invention is thus to be construed as including all possible modifications and variations encompassed within the scope of the claims of the issued patent.

What is claimed is:

1. A system comprising:
   means for arranging a series of data units in a Non-Volatile Memory (NVM) in a first order, each of the data units associated with a respective one of a plurality of timestamps;
   means for arranging a series of data map units in the NVM in a second order, each of the data map units associated with a respective one of the timestamps;
   means for determining a latest valid and contiguous one of the data units;
   means for determining a latest valid and contiguous one of the data map units, wherein the respective timestamp associated with the latest valid and contiguous one of the data map units is at or before the respective timestamp associated with the latest valid and contiguous one of the data units;
   means for recovering only ones of the data map units up to the latest valid and contiguous one of the data map units;
   wherein each of the data map units comprises a location in the NVM of a corresponding one of the data units;
   wherein the respective timestamp associated with each of the data units is at or before the respective timestamp associated with the corresponding data map unit; and
   whereby any of the data map units associated with any of the respective timestamps after the respective timestamp associated with the latest valid and contiguous one of the data units are ignored in recovery.

2. The system of claim 1, wherein:
   each of the data units corresponds to a respective data write from a host to a respective Logical Block Address (LBA);
   a prior one and a subsequent one of the data units correspond to ones of the data writes to a same one of the respective LBAs; and
   the prior data unit does not have an associated one of the data map units.

3. The system of claim 1, further comprising a means for interfacing with a host to communicate information read from and/or written to the NVM.

4. The system of claim 3, wherein the means for interfacing is compatible with one or more of
   a Universal Serial Bus (USB) interface standard,
   a Compact Flash (CF) interface standard,
   a MultiMediaCard (MMC) interface standard,
   an embedded MMC (eMMC) interface standard,
   a Thunderbolt interface standard,
   a UFS interface standard,
   a Secure Digital (SD) interface standard,
   a Memory Stick interface standard,
   an xD-picture card interface standard,
   an Integrated Drive Electronics (IDE) interface standard,
   a Serial Advanced Technology Attachment (SATA) interface standard,
   an external SATA (eSATA) interface standard,
   a Small Computer System Interface (SCSI) interface standard,
   a Serial Attached Small Computer System Interface (SAS) interface standard,
   a Fibre Channel interface standard, an Ethernet interface standard, and
a Peripheral Component Interconnect express (PCIe) interface standard.

5. The system of claim 3, wherein the host comprises one or more of
a computer,
a workstation computer,
a server computer,
a storage server,
a Storage Attached Network (SAN),
a Network Attached Storage (NAS) device,
a Direct Attached Storage (DAS) device,
a storage appliance,
a Personal Computer (PC),
a laptop computer,
a notebook computer,
a netbook computer,
a tablet device or computer,
an ultrabook computer,
an electronic reading device (an e-reader),
a Personal Digital Assistant (PDA),
a navigation system,
a (handheld) Global Positioning System (GPS) device,
an automotive control system,
an automotive media control system or computer,
a printer, copier or fax machine or all-in-one device,
a Point Of Sale (POS) device,
a cash-register,
a media player,
a television,
a media recorder,
a Digital Video Recorder (DVR),
a digital camera,
a cellular handset,
a cordless telephone handset, and
an electronic game.

6. The system of claim 5, further comprising all or any portions of the host.

7. The system of claim 1, further comprising a means for interfacing with one or more flash memories comprising all or portions of the NVM.

8. The system of claim 7, wherein the means for interfacing is compatible with one or more of
an Open NAND Flash Interface (ONFI),
a Toggle-mode interface,
a Double-Data-Rate (DDR) synchronous interface,
a DDR2 synchronous interface;
a synchronous interface, and
an asynchronous interface.

9. The system of claim 7, wherein at least one of the flash memories comprises one or more of
NAND flash technology storage cells, and
NOR flash technology storage cells.

10. The system of claim 7, wherein at least one of the flash memories comprises one or more of
Single-Level Cell (SLC) flash technology storage cells, and
Multi-Level Cell (MLC) flash technology storage cells.

11. A system comprising:
means for writing a series of data storage units in a Non-Volatile Memory (NVM), each of the data storage units associated with a respective one of a plurality of timestamps;
means for writing a series of data map units in the NVM, each of the data map units associated with a respective one of the timestamps, and wherein the writing of the data storage units is in accordance with a first order and the writing of the data map units is in accordance with a second order;
means for determining, in accordance with the first order, a latest valid and contiguous one of the data storage units;
means for determining, in accordance with the second order, a latest valid and contiguous one of the data map units associated with a one of the respective timestamps indicating a relative age that is identical to or older than a relative age indicated by the respective timestamp associated with the latest valid and contiguous one of the data storage units;
means for recovering, in accordance with the first and the second orders, only ones of the data map units up to the latest valid and contiguous one of the data map units;
wherein each of the data map units comprises a location in the NVM of a corresponding one of the data storage units; and
wherein the respective timestamp associated with each of the data storage units indicates a relative age that is identical to or older than a relative age indicated by the respective timestamp associated with the corresponding data map unit.

12. The system of claim 11, wherein:
a first one of the data storage units corresponds to a first data write from a host to a particular Logical Block Address (LBA);
a second one of the data storage units corresponds to a second data write from the host to the particular LBA;
the first data write precedes, in time order, the second data write; and
none of the data map units correspond to the first data storage unit.

13. A system comprising:
means for writing a series of data storage units in a Non-Volatile Memory (NVM), each of the data storage units associated with a respective one of a plurality of timestamps;
means for writing a series of data map units in the NVM, each of the data map units associated with a respective one of the timestamps, and wherein the writing of the data storage units is in accordance with a first order and the writing of the data map units is in accordance with a second order;
means for determining, in accordance with the first order, a first one of the data storage units that is a latest valid and contiguous one of the data storage units;
means for determining, in accordance with the second order, a latest valid and contiguous one of the data map units associated with a one of the respective timestamps indicating a relative age that is identical to or older than a relative age indicated by the respective timestamp associated with the latest valid and contiguous one of the data storage units;
means for determining, in accordance with the first order, a second one of the data storage units that is a latest one of the data storage units associated with a one of the respective timestamps indicating a relative age that is identical or prior to a determined amount preceding the relative age indicated by the respective timestamp associated with the latest valid and contiguous one of the data map units;
means for recovering, in accordance with the first and second orders, ones of the data map units up to the latest valid and contiguous one of the data map units using ones of the data units solely from the second of the data storage units through the first of the data storage units;

wherein each of the data map units comprises a location in the NVM of a corresponding one of the data storage units; and wherein the respective timestamp associated with each of the data storage units indicates a relative age that is identical to or older than a relative age indicated by the respective timestamp associated with the corresponding data map unit.

14. The system of claim 13, further comprising:

means for identifying, for each modified one of the data map units not previously written to the NVM, a respective one of the timestamps associated with an oldest update equal to the respective timestamp associated with a particular one of the data storage units, the modified data map unit comprising the location in the NVM of the particular data storage unit; and means for writing each of the modified data map units not previously written to the NVM, to the NVM at or prior to writing one of the data storage units associated with a one of the respective timestamps more than the determined amount following the respective timestamp associated with the oldest update of the modified data map unit.

15. The system of claim 13, wherein:

a first one of the data storage units corresponds to a first data write from a host to a particular Logical Block Address (LBA);

a second one of the data storage units corresponds to a second data write from the host to the particular LBA;

the first data write precedes, in time order, the second data write; and none of the data map units correspond to the first data storage unit.

* * * * *